United States Patent
Johannsen

(10) Patent No.: US 6,728,939 B2
(45) Date of Patent: Apr. 27, 2004

(54) METHOD OF CIRCUIT VERIFICATION IN DIGITAL DESIGN

(75) Inventor: Peer Johannsen, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 37 days.

(21) Appl. No.: 10/038,870

(22) Filed: Jan. 8, 2002

(65) Prior Publication Data

US 2002/0138812 A1 Sep. 26, 2002

(30) Foreign Application Priority Data

Jan. 8, 2001 (DE) ......................................... 101 00 433
Apr. 5, 2001 (EP) ............................................ 01108653

(51) Int. Cl.[7] ............................................. G06F 17/50
(52) U.S. Cl. ................................. 716/5; 716/4; 716/18
(58) Field of Search ..................... 716/1–18; 703/13–15

(56) References Cited

U.S. PATENT DOCUMENTS

| | | | | |
|---|---|---|---|---|
| 5,471,398 A | * | 11/1995 | Stephens | 716/21 |
| 5,517,132 A | * | 5/1996 | Ohara | 326/41 |
| 5,598,344 A | * | 1/1997 | Dangelo et al. | 716/18 |
| 5,841,663 A | * | 11/1998 | Sharma et al. | 716/18 |
| 6,163,876 A | * | 12/2000 | Ashar et al. | 716/5 |
| 6,321,173 B1 | * | 11/2001 | Foster | 702/109 |
| 6,324,671 B1 | * | 11/2001 | Ratzel et al. | 716/1 |
| 6,519,755 B1 | * | 2/2003 | Anderson | 716/18 |
| 6,523,153 B1 | * | 2/2003 | Takemura et al. | 716/5 |

OTHER PUBLICATIONS

Reducing bitvector satisfiability problems to scale down design sizes for RTL property checking, Peer Johannsen, workshop 2001. Proceedings. Sixth IEEE International, Nov. 7–9, 2001, pp.:123–128.*

Cyrluk, et al.; "An Efficient Decision Procedure for the Theory of Fixed–Sized Bit–Vectors", CAV '97 pp. 6–71, 1997.

Barrett et al., "Validity Checking for Cominations of Theories with Equality"; FMCAD '96, pp. 187–201, 1996.

Barrett et al., "A Decision Procedure for Bit–Vector Arithmetic", DAC '98 pp. 522–527, 1998.

Bryant et al., Exploiting Positive Equality in a Logic of Equality with Uninterpretede Functions, CAV '99 pp. 470–482, 1999.

Bjørner et al, "Deciding Fixed and Non–fixed Size Bit–vectors", TACAS '98, pp. 376–392, 1998.

Velev et al., "Exploiting Positive Equality and Partial Non–Consistency in the Formal Verification of Pipelined Microprocessors", DAC '99, pp. 397–401, 1999.

(List continued on next page.)

Primary Examiner—Vuthe Siek
Assistant Examiner—Paul Dinh
(74) Attorney, Agent, or Firm—Staas & Halsey LLP

(57) ABSTRACT

The present invention relates to a method of circuit verification in digital design and in particular, relates to a method of register transfer level property checking to enable the same. Today's electrical circuit designs frequently contain up to several million transistors, and circuit designs need to be checked to ensure that circuits operate correctly. Formal methods for verification are becoming increasingly attractive since they confirm design behavior without exhausting simulating a design. A digital circuit design verification method, prior to a property checking process for each property of a non-reduced RTL model, determines a reduced RTL model which retains specific signal properties of a non-reduced RTL model which are to be checked. A linear signal width reduction causes an exponential reduction of the induced state space. Reducing state space sizes in general goes hand in hand with reduced verification runtimes, thus speeding up verification tasks.

13 Claims, 19 Drawing Sheets

OTHER PUBLICATIONS

Velev et al., "Bit–Level Abstraction in the Verification of Pipelined Microprocessory by Correspondence Checking", FMCAD '98, pp. 18–35 1998.

Huang et al., "Assertion Checking by Combined Word–Level ATPG and Modular Arithmetic Constraint–Solving Techniques", DAC '00, pp. 118–123, 2000.

Cyrluk, et al.; "An Efficient Decision Procedure for the Theory of Fixed–Sized Bitvectors with Composition and Extraction", Technical Report No. UIB–96–8 (Ulmer Informatik–Berichte 96–08), Fakultat fur Informatik, Universität Ulm, 1996.

Levitt, "Formal Verification Techniques for Digital Systems", PhD Thesis at the Department of Electrical Engineering, Stanford University, 1998.

Silva, "Search Algorithms for Satisfiability Problems in Combinational Switching Circuits", PhD Thesis, University of Michigan, 1995.

Silva et al., "Boolean Satisfiability Algorithms and Applications in Electronic Design Automation", CAV '00, Invited Tutorial, 2000.

Möller, "A Decision Procedure for Hardware Verification", Diploma Thesis, University of Ulm, 1998.

Möller et al., "Solving Bit–Vector Equations", FMCAD '98, pp. 36–48, 1998.

* cited by examiner

Fig.3

| Bitvector Operator | Syntax | Example |
|---|---|---|
| bitvector variables<br>bitvector constants | $x_{[n]}$<br>$c_{[m]}$ | $x_{[8]}, y_{[1]}, z_{[4]}, \ldots$<br>$10011_{[5]}, 00111111_{[8]}, 0_{[1]}, 1_{[1]}, \ldots$ |
| concatenation | $\otimes$ | $x_{[16]} \otimes y_{[4]}$ |
| extraction | $[j, i]$ | $x_{[8]}[5, 2]$ |
| bitwise negation (inversion) | | $neg(x_{[8]})$ |
| bitwise Boolean operations | and, or, xor<br>nand, nor, xnor | $x_{[12]}$ and $y_{[12]}, x_{[12]}$ or $y_{[12]}, x_{[12]}$ xor $y_{[12]}$<br>$x_{[12]}$ nand $y_{[12]}, x_{[12]}$ nor $y_{[12]}, x_{[12]}$ xnor $y_{[12]}$ |
| if-then-else | ite | $ite(a_{[4]} = b_{[4]}, x_{[8]}, y_{[8]})$<br>$ite(a_{[4]} < b_{[4]}, x_{[8]}, y_{[8]})$ |
| arithmetic | +, −<br>* | $x_{[32]} + y_{[32]}, x_{[32]} - y_{[32]}$<br>$x_{[16]} * y_{[16]}$ |
| memory read<br>memory write | $mem_{[m \cdot n]}[i_{[l]}]$ | $x_{[10]} := mem_{[128 \cdot 10]}[i_{[7]}]$<br>$mem_{[32 \cdot 8]}[i_{[5]}] := x_{[8]}$ |

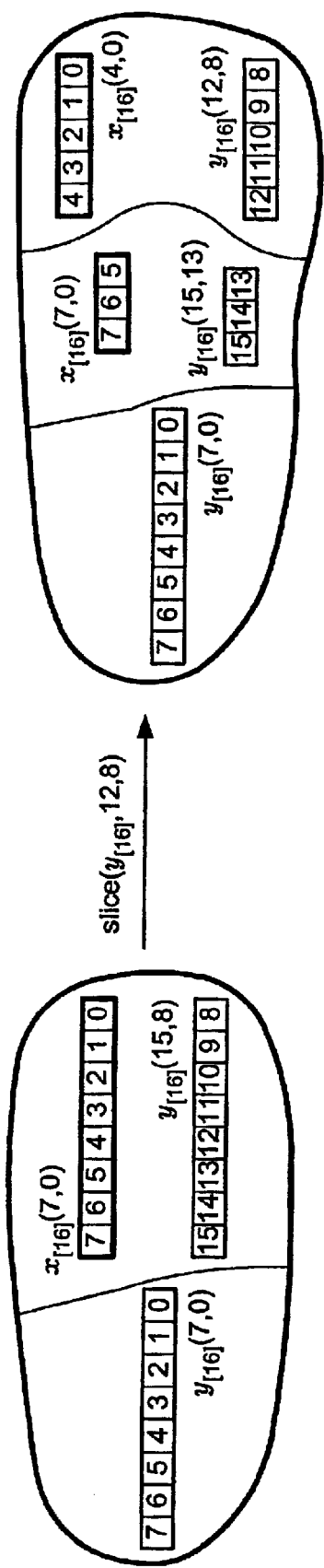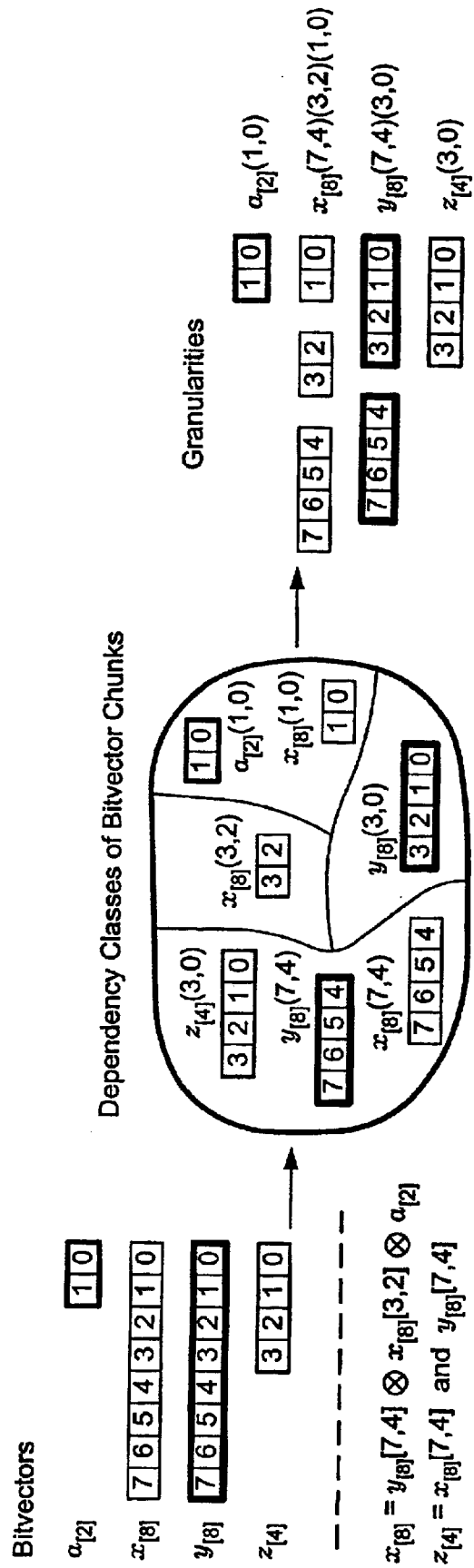
Fig.5
Fig.6

Fig. 6a

Process 1 Granularity Analysis of Bitvector Equations

```
1   gran(e) {
2     switch (e);
3     case e ≡ 's_{[n]} = t_{1[m_1]} ⊗ t_{2[m_2]}':
4     case e ≡ 's_{[n]} = (t_{1[m_1]} ⊗ t_{2[m_2]})[j,i]':
5       gran(' s_{[n]}[n-1, m_2] = t_{1[m_1]}') ; gran(' s_{[n]}[m_2-1,0] = t_{2[m_2]}') ;
6       if (j < m_2) {
7         gran(' s_{[n]} = t_{2[m_2]}[j, i]') ;
8       } else if (i ≥ m_2) {
9         gran(' s_{[n]} = t_{1[m_1]}[j-m_2, i-m_2]') ;
10      } else {
11        gran(' s_{[n]} = t_{1[m_1]}[j-m_2, 0] ⊗ t_{2[m_2]}[m_2-1, i]') ;
12      }
13    case e ≡ 's_{[n]} = (t_{[n]}[l,k])[j,i]':
14      gran(' s_{[n]} = t_{[n]}[k+j, k+i]') ;
15    case e ≡ 's_{[n]} = ite(a_{[m]} = b_{[m]}, t_{t[n]}, t_{e[n]})[j,i]':
16      gran(' s_{[n]} = ite(a_{[m]} = b_{[m]}, t_{t[n]}[j,i], t_{e[n]}[j,i])') ;
17    case e ≡ 's_{[n]} = (t_{1[m]} and t_{2[m]})[j,i]':
18      gran(' s_{[n]} = t_{1[m]}[j,i] and t_{2[m]}[j, i]') ;
19    ...
20    case e ≡ 's_{[n]} = neg(t_{[n]})':
21      gran(' s_{[n]} = t_{[n]}') ;
22    case e ≡ 's_{[n]} = ite(a_{[m]} = b_{[m]}, t_{t[n]}, t_{e[n]})':
23      gran(' a_{[m]} = b_{[m]}') ; gran(' s_{[n]} = t_{t[n]}') ; gran(' s_{[n]} = t_{e[n]}') ;
24    case e ≡ 's_{[n]} = t_{1[n]} and t_{2[n]}':
25      gran(' s_{[n]} = t_{1[n]}') ; gran(' s_{[n]} = t_{2[n]}') ;
26    ...
27    case e ≡ 'x_{[n]}[j,i] = y_{[m]}[l,k]':
28      slice(x_{[n]},j,i) ; slice(y_{[m]},l,k) ; join(x_{[n]}⟨j,i⟩, y_{[m]}⟨l,k⟩) ;
29  }
```

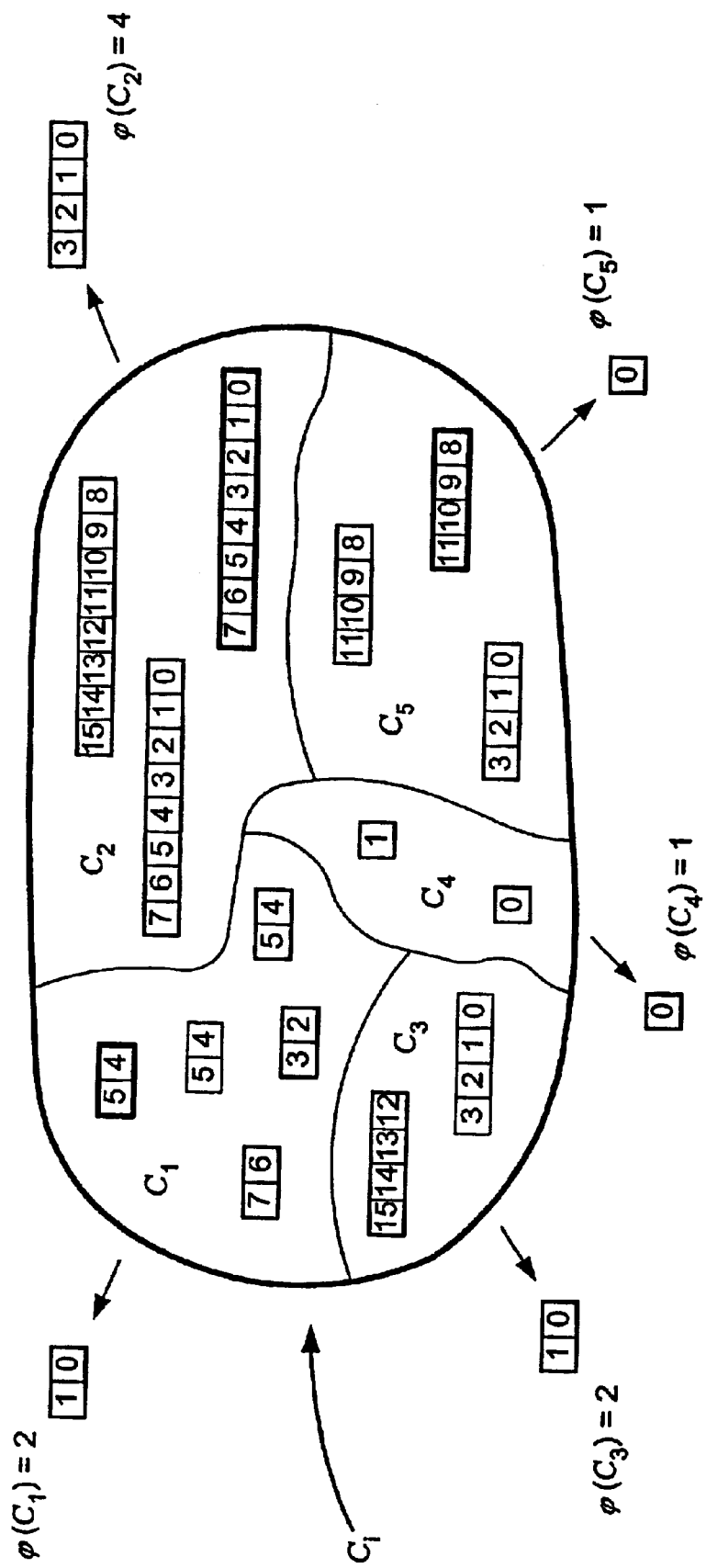

Fig.7a

Process 2  Reduced Model Generation

```
1   for each bitvector variable x_{[n]} {
2     m := 0 ;
3     for each chunk x_{[n]}⟨j, i⟩ of the computed granularity of x_{[n]} {
4       C := find(x_{[n]}⟨j, i⟩);   // equivalence class containing x_{[n]}⟨j,i⟩
5       m := m + φ(C);
6     }
7     if (m ≥ n) then m := n ;
8     replace all occurrences of x_{[n]} in the bitvector equations by x'_{[m]} ;
9     and adjust all extraction expressions affected by x_{[n]} ;
10  }
```

Fig. 9

| | Property | Original design | Reduced model |
|---|---|---|---|
| Computation times of the prototype for analysis and reduced model generation | nop<br>read<br>write | | 2.96 secs<br>6.53 secs<br>3.24 secs |
| FIFO sizes on RTL | nop<br>read<br>write | 160 cells x 10 bit<br>160 cells x 10 bit<br>160 cells x 10 bit | 160 cells x 2 bit<br>160 cells x 3 bit<br>160 cells x 3 bit |
| Overall number of bits in all relevant signals (cones of influence of the property) | nop<br>read<br>write | 20925<br>31452<br>14622 | 5034 (24.0 %)<br>10592 (33.6 %)<br>5163 (35.3 %) |
| Overall number of gates in synthesized netlist | nop<br>read<br>write | 23801<br>23801<br>23801 | 5661 (27.9 %)<br>7929 (33.3 %)<br>7929 (33.3 %) |
| Number of state bits | nop<br>read<br>write | 1658<br>1658<br>1658 | 362 (21.8 %)<br>524 (31.6 %)<br>524 (31.6 %) |
| Property checker runtimes | nop<br>read<br>write_fail<br>write_hold | 23:33 min<br>42:23 min<br>2:08 min<br>27:08 min | 37.96 secs (2.7 %)<br>3:27 min (8.1 %)<br>25.66 secs (19.5 %)<br>1:08 min (4.2 %) |

METHOD OF CIRCUIT VERIFICATION IN DIGITAL DESIGN

FIELD OF THE INVENTION

The present invention relates to a method of circuit verification in digital design and in particular relates to a method of register transfer level property checking to enable the same.

BACKGROUND OF THE INVENTION

Today's electrical circuit designs frequently contain up to several million transistors and circuit designs need to be checked to ensure that circuits operate correctly. Formal methods for verification are becoming increasingly attractive since they confirm design behaviour without exhaustively simulating a design. Over the past years, bounded model checking and bounded property checking have increased in significance in electronic design automation (EDA). When checking large industrial circuits, long run times, ranging between hours and several days, are quite common. With designs continually increasing in size and complexity the test for correct behaviour becomes more important and a major economic issue, but at the same time becomes more complex, time consuming and expensive. Automated abstraction techniques have been developed to enhance capabilities of formal verification methods.

Abstraction techniques are used as a pre-process in high-level property checking of digital circuits. The majority of today's industrial hardware verification tools use bit-level decision procedures, like decision procedures for the Boolean satisfiability problem (SAT) or decision procedures based on binary decision diagrams (BDDs). In electronic design automation, SAT procedures have many direct applications, including test pattern generation, timing analysis, logic verification, functional testing, etc. SAT belongs to the class of NP-complete problems, with algorithmic solutions having exponential worst case complexity. This problem has been widely investigated and continues to be so because efficient SAT techniques can greatly affect the operation of many EDA tools. For example in VLSI CAD, SAT formulations start from an abstract circuit description, for which a required output value needs to be validated. The resulting formulation is then mapped on to an instance of SAT. Conjunctive Normal Form (CNF) formulae can be used and several versions of this procedure incorporate a chronological backtrack-determination: at each node in the search tree, an assignment is selected and a subsequent search procedure is controlled by iterative application of "unit clauses" and "pure literal rules". Non-chronological backtrack determinations are also known. An alternative to SAT are BDDs: a set of BDD's can be constructed representing output value constraints. The conjunction of all the constraints expressed as a Boolean product of the corresponding BDD (termed as a product BDD) represents the set of all satisfying solutions. Any element of the resulting constraint set gives a feasible SAT solution. However a major limitation of this approach is that there is a corresponding exponential increase in memory requirement for the operating system and in run times of the verification tools. The CNF-based SAT solvers can be directly applied to circuits, which are broken down into bit-level Boolean logic, by transforming the entire circuit into CNF formulae. However, since practical gate-level circuit descriptions can be quite large, dealing with substantially large CNF formulae results in unacceptable CPU run times. However, circuit designs are usually defined in terms of Register-Transfer-Level (RTL) specifications, for example, coded in hardware description languages (HDL's) like VHDL or Verilog. RTL specifications of digital circuits contain explicit structural information which is lost in bit-level descriptions. At the bit-level, for example in gate lists, all signals are of 1-bit width and all available functional units are Boolean gates. In contrast, with RTL, word-level data structures, for example bit-vectors and buses, as well as high-level operators, for example adders, multipliers and shifters, are still visible. Several approaches to formal circuit verification have been proposed which make use of such high level information.

D. Cyrluk et al present a word-level decision procedure for the core theory of bit-vectors with extraction and concatenation in "An efficient decision procedure for the theory of fixed sized bit-vectors" (CAV-97), pages 60 to 71, 1997, using bit-vector BDDs and applying width abstraction to the core theory.

OBJECT OF THE INVENTION

The present invention seeks to provide an improved circuit verification procedure.

STATEMENT OF THE INVENTION

In accordance with a first aspect of the invention, there is provided a digital circuit design verification method wherein, prior to a property checking process for each property of a non-reduced RTL model, a reduced RTL model is determined, which reduced RTL model retains specific signal properties of a non-reduced RTL model which are to be checked.

Conveniently the design verification process comprises, in a step prior to the determination of a reduced width RTL model, of determining the design specification of the digital circuit design and the specification of the properties to be investigated, synthesizing an RTL netlist of high level primitives, whereby the circuit is defined as an interconnection of control and data path portions, wherein signals of a width n are determined such that $n \in N_+$, wherein bitvectors of respective length determine the signal value and $N_+$ represents the natural numbers (excluding 0). i.e. 1, 2, 3, . . . Conveniently, in the property checking process, an internal bit level representation contains a bit level variable for each bit of each word signal. This bit-level representation is passed to a verification engine and then to a property test unit which operates to provide a positive result if the investigated property holds true for the circuit and which operates to provide a counter-example if the property does not hold. In the event that a counter-example is produced for the reduced RTL design, signal width enhancement is performed to create a counter-example for the original RTL.

wherein bitvectors of respective length determine the signal value. Conveniently, in the property checking process, an internal bit level representation contains a bit level variable for each bit of each word signal. This bit-level representation is passed to a verification engine and then to a property test unit which operates to provide a positive result if the investigated property holds true for the circuit and which operates to provide a counter-example if the property does not hold. In the event that a counter-example is produced for the reduced RTL design, signal width enhancement is performed to create a counter-example for the original RTL.

In accordance with a further aspect of the present invention there is provided a digital circuit design verification tool wherein a pre-property checking unit is operable to reduce the widths of the signals occurring in an RTL model of an input design specification and an input property specification, which reduced width RTL model retains the specific signal property of a non-reduced RTL model.

Preferably the tool further comprises a front end unit operable to receive input data relating to a design specification and the property characteristics of a design to be verified and is operable to provide an RTL netlist of the circuit design and property whereby the circuit can be defined as an interconnection of control and data path portions, wherein in signals of a width n are determined such that $n \in \mathbb{N}_+$; and bitvectors of a respective length determine the signal value. Conveniently a property checking unit is operable to create an internal bit level representation having received a reduced RTL representation. This representation is sequentially passed to a verification engine and to a property test unit. The property test unit being operable to provide a positive result if the circuit property holds true and which is operable to provide a counter-example in the case of the property does not hold. Conveniently the signal width enhancement unit is operable to receive counter-examples for reduced RTL data and to expand the signal width to provide a counter example for the original RTL.

A linear signal width reduction causes an exponential reduction of the induced state space. Reducing state space sizes in general goes hand in hand with reduced verification runtimes. Thus the technique holds a high potential for speeding up verification tasks. Tests have shown that the present invention can significantly reduce the runtimes of existing prover tools. Furthermore, the present invention will be able to process design sizes which have, hitherto, exceeded the capacities of existing verification tools and which could not be taken into account before due to resource limitations. FIFO's, queues, stacks, bridges and interface protocols comprise part of a class of digital hardware designs to which the present invention is particularly well suited to processing.

A further advantage of the present invention is that, if the analysis yields that no reduction at all is possible for a given design and a given property, then reduced model and original design are identical. The verification task itself cannot be impaired by using the proposed method as a pre-process, and in all case studies pre-processing runtimes were negligible Furthermore, the technique can be applied in high-level equivalence checking and high-level simulation. High-level equivalence checking, for example, can be considered a special case of high-level property checking. The design specification can include two different implementations of the same circuit and the property can require functional equivalence, or the property itself can be written in a hardware description language representing a functional specification of the circuit.

BRIEF DESCRIPTION OF THE FIGURES

The invention may be understood more readily, and various other aspects and features of the invention may become apparent, from consideration of the following description and the figures as shown in the accompanying drawing sheets, wherein:

FIG. 3 is a table detailing the syntax of various bit-vector operators supported in the reduction technique of this invention;

FIG. 5 shows the effect of slicing equivalence classes;

FIG. 6 illustrates a granularity analysis in terms of bit-vectors, dependency classes of bit-vector chunks and granularities; and FIG. 6a details a process for determining the granularity analysis of bit-vector equations;

FIG. 7 illustrates a minimum width computation for a dependency class;

FIG. 7a details a process for reduced model generation;

FIG. 9 comprises tabulated results of the address management unit shown in FIG. 8;

DETAILED DESCRIPTION OF INVENTION

There will now be described by way of example, the best mode contemplated by the inventor for carrying out the invention. In the following description numerous specific details are set out in order to provide a complete understanding of the invention. It will be apparent however, to those skilled in the art, that the present invention may be put in to practice with variations of the specific.

Figure 1A:
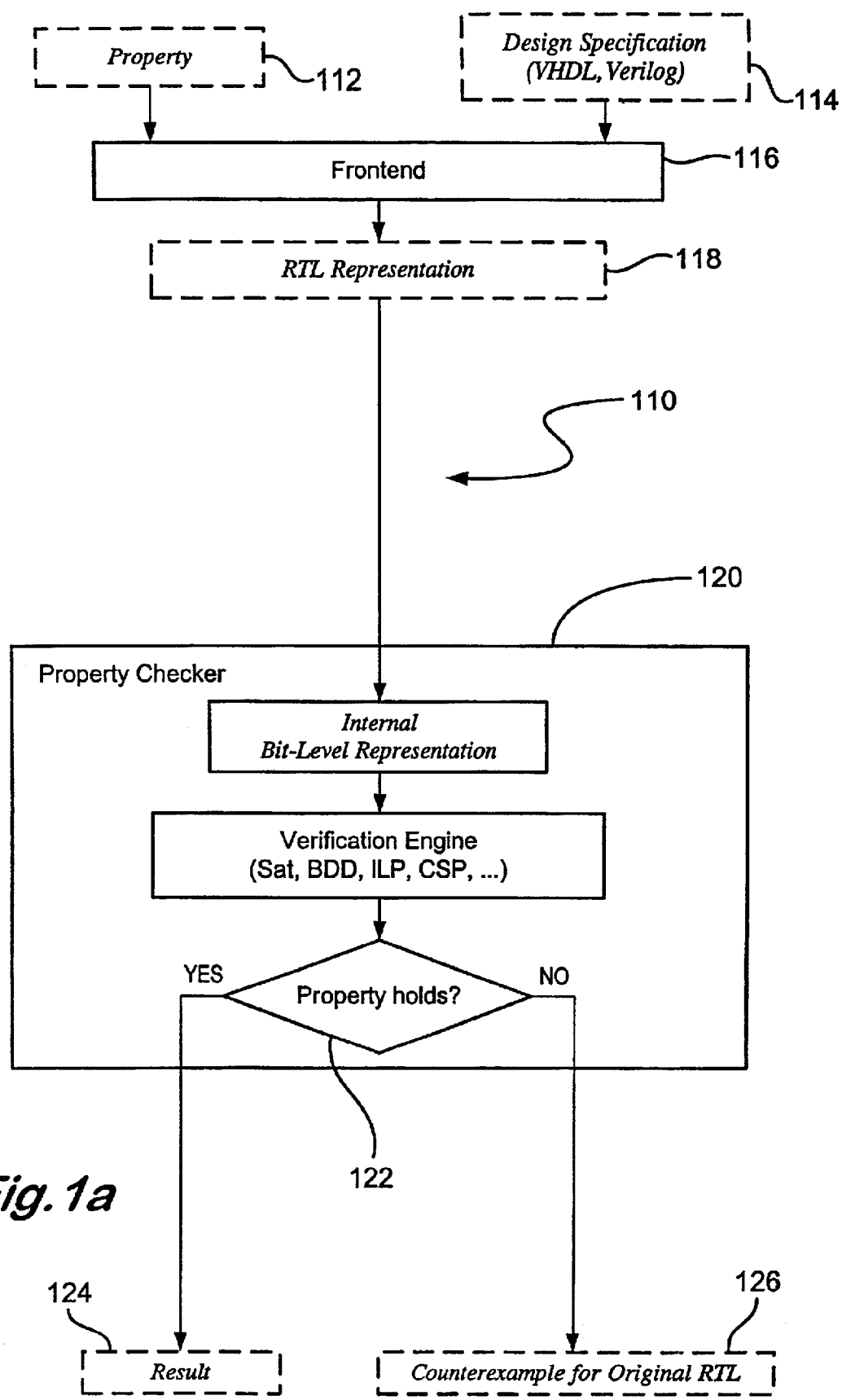
FIGS. 1a and 1b show property checking flow diagrams.

Referring to FIG. 1a there is shown a prior-art property checking flow diagram. A property specification, 112, and a design specification, 114, is presented to a bounded property checker, 120. The property and design specifications, 112, 114, are input to a front end processor which converts the specifications to Register Transfer Level (RTL) specifications. A decision relating to the property is made at decision point 122: if the property holds then the design feature is confirmed 124; if the property does not hold, then a counterexample 126 is determined. A counterexample, as is known, is an indication that a circuit does not function in the way intended by the designer; a counterexample is given in terms of assignments of values to the circuit inputs such that a violation of the desired behaviour which is described by the property specification can be observed when looking a the values of the circuit outputs resulting from the circuit inputs. A design modification would be made to eliminate the occurrence of the counterexample and, indeed, further counterexamples which may consequentially arise.

The present invention employs the use of properties described in a linear time logic over finite bounded intervals of time. Properties consist of an assumption part which implies a commitment part:

Property Assumptions=>Commitment

Figure 1B:
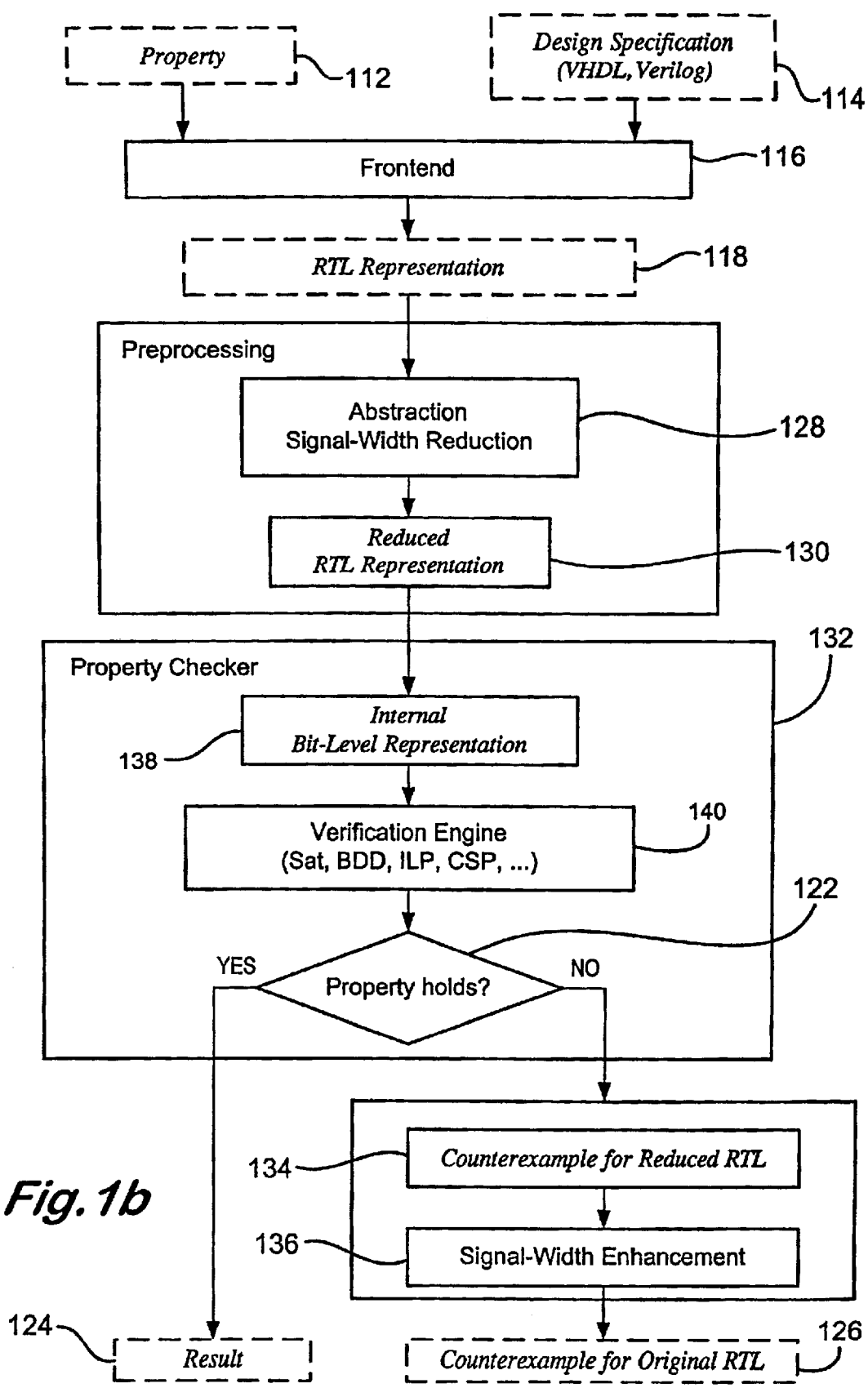

Properties specify the intended behaviour of the design within a finite interval of time and consist of temporal operators and state expressions, involving relationships among data words. As an example consider:

assume (during [t+0, t+4]: reset=0) and (at t+0: request=1);

prove (at t+3: acknowledge=1) and (at t+4: data= 11111111);

Referring now to FIG. 1b, there is shown a property-checking flow in accordance with the invention. As a first step, design and property are synthesized into a flattened netlist of high-level primitives, called an RTL netlist, as is known. These netlists include word-level signals, word-level gates, arithmetic units, comparators (data to control), multiplexors (control to data) and memory elements Each signal x has a fixed given width $n \in \mathbb{N}_+$ and takes bitvectors of respective length as values. The RTL representation of the design is handed to a property checker which translates the netlist into a bit-level representation and either proves that the property holds for the given design, or returns a counterexample.

In a pre-processing step prior to the invocation of the property checker, the RTL netlist is obtained, 118, and a scaled down RTL model 130 is computed by signal-width reduction processor, 128, in which signal widths are reduced, while guaranteeing that:

The property holds for the original RTL<==>The property holds for the reduced RTL The reduced RTL, 130, is given to the property checker, 132, instead of the original RTL. The internal bit-level representation, 138, used by the property checker contains a bit-level variable for each bit of each word-level signal of the RTL representation, and, depending on the degree of reduction of the signal widths, now can contain significantly less variables for the reduced RTL. The property checker, 132 includes a verification engine (SAT, BDD . . . ), 140. If the property does not hold, the property checker returns a counterexample in terms of an assignment of values to all inputs of the reduced RTL, 134. The method provides a technique which takes such counterexample and generates an assignment of values to the inputs of the original design in a signal width enhancement step by signal width enhancement processor, 136, such that the property does not hold when these input values are applied to the circuit, and provides a counterexample, 126.

The invention conveniently uses structural data-path dependency analyses for minimum width abstractions. The basic idea is illustrated by the following introductory examples.

In a first example, example 1, we assume we want to check if the conjunction of two word-level signals of width 8, denoted by x[8] and y[8] can evaluate to the 8-bit zero vector. Let 'and' denote bitwise Boolean conjunction. In RTL, we have to check if the equation $$x_{[8]} \text{ and } y_{[8]} = 00000000 \quad (1)$$

is satisfiable. A corresponding bit-level representation of the same problem involves 16 variables and 8 equations. It is not necessary to solve all 8 equations because bit positions 0–7 are treated uniformly. Let $x'_{[1]}$ and $y'_{[1]}$ denote signals of width 1. It is sufficient to check if:

$$x'_{[1]} \text{ and } y'_{[1]} = 0 \quad (2)$$

is satisfiable, because (1) is satisfiable if and only if (2) is satisfiable. Furthermore, a satisfying solution for (1) can be obtained from a satisfying solution of (2) by copying the values of $x'_{[1]}$ 1 and $y'_{[1]}$ into all bit positions of the corresponding signals of (1). For example, $x'_{[1]}=1$, yields $x_{[8]}=00000000$ and $y_{[8]}=11111111$.

In the example above, signals $x_{[8]}$ and $Y_{[8]}$ both could be reduced to a width of one bit. In general, reduction depends on the structural data dependencies occurring in the cone of influence of a signal in a given design.

In a second example, given the assumptions of Example 1, we let $Z_{[4]}$ be an additional word-level signal of width 4 and assume that $Z_{[4]}$ is assigned to the 4 most significant bits of $x_{[8]}$. That is to say we have to check if the following system of equations is satisfiable:

$$x_{[8]}[7,4]=z_{[4]}$$

$$x_{[8]} \text{ and } y_{[8]}=00000000 \quad (3)$$

Bit positions 0–3 as well as 4–7 are treated uniformly, though both cases in a different way. Signals $x_{[8]}$ and $y_{[8]}$ have to be split. Let $x^1_{[2]}$, $y^1_{[2]}$ and $z^1_{[1]}$ denote signals of width 2 and 1 respectively, and consider:

$$x^1_{[2]}[1,1]=z^1_{[1]}$$

$$x^1_{[2]} \text{ and } y_{[2]}=00 \quad (4)$$

System (3) is satisfiable if and only if (4) is satisfiable. To obtain a solution of (3), we copy $x^1_{[2]}[1,1]$ into all positions of $x_{[8]}[7,4]$ and $x'_{[2]}[0,0]$ into all positions of $x_{[8]}[3,0]$. The same is done for $y'_{[2]}$ and $y_{[8]}$, and $z'_{[1]}$ is copied into all positions of $Z_{[4]}$. For example, $x'_{[2]}=10$, $y'_{[2]}=01$, $z'_{[1]}=1$, yields $x_{[8]}=11110000$, $y_{[8]}=00001111$ and $z_{[4]}=1111$.

Signals $x_{[8]}$ and $y_{[8]}$ are both split into two parts, and each part can be reduced to a width of one bit, resulting in an overall width of 2 bits for $x'_{[2]}$ and $y'_{[2]}$. In general, it is not always possible to reduce a chunk of bits processed in exactly the same manner to only one bit. Equations containing dynamic data dependencies, e.g. if-then-else operators, require an analysis of all possible inequalities between signals, as shown in the following example.

In a third example, we let $x_{[8]}$, $y_{[8]}$ and $z_{[8]}$ be data signals of width 8, and let $a_{[1]}$, $b_{[1]}$ and $c_{[1]}$ be control signals. The satisfiability of the following system of equations can be characterised as:

$$a_{[1]} = ite(x_{[8]} = y_{[8]}, 0_{[1]}, 1_{[1]})$$

$$b_{[1]} = ite(y_{[8]} = z_{[8]}, 0_{[1]}, 1_{[1]})$$

$$c_{[1]} = ite(z_{[8]} = x_{[8]}, 0_{[1]}, 1_{[1]}) \overset{satisfiable}{\Longleftrightarrow} x_{[8]} \neq y_{[8]} \wedge y_{[8]} \neq z_{[8]} \wedge z_{[8]} \neq x_{[8]}$$

$$1_{[1]} = a_{[1]} \text{ and } b_{[1]} \text{ and } c_{[1]}$$

Obviously, $x_{[s]}$, $y_{[8]}$ and $z_{[8]}$ cannot be reduced to a width of only one bit, because $x_{[8]} \neq y_{[8]} \hat{} y_{[8]} \neq z_{[8]} \hat{} z_{[8]} \neq x_{[8]}$ is satisfiable, while $x'_{[1]} \neq y'_{[1]} \hat{} y'_{[1]} \neq z'_{[1]} \hat{} z'_{[1]} \neq x'_{[1]}$ is not. Insted the following holds:

Instead, the following holds:

$x_{[m]} \neq y_{[m]} \hat{} y_{[m]} \neq z_{[m]} \hat{} z_{[m]} \neq x_{[m]}$ is satisfiable for all $m \geq 2$.

Therefore, 2 is the minimum value for m which $$x_{[8]} \neq y_{[8]} \wedge y_{[8]} \neq z_{[8]} \wedge z_{[8]} \neq x_{[8]} \stackrel{satisfiable}{\Longleftrightarrow} x_{[m]} \neq y_{[m]} \wedge y_{[m]} \neq z_{[m]} \wedge z_{[m]} \neq x_{[m]}$$

is true, and thus the original system of equations can be replaced by $a'_{[1]} = ite(x'_{[2]} = y'_{[2]}, 0_{[1]}, 1_{[1]})$
$b'_{[1]} = ite(y'_{[2]} = z'_{[2]}, 0_{[1]}, 1_{[1]})$
$c'_{[1]} = ite(z'_{[2]} = x'_{[2]}, 0_{[1]}, 1_{[1]})$
$1_{[1]} = a'_{[1]}$ and $b'_{[1]}$ and $c'_{[1]}$ Without changing satisfiability.

A satisfying solution for the original system can be obtained from a solution of (5) by a sign extension of the values of the reduced variables, e.g of the reduced variables, e.g., $x'_{[2]} = 00$, $y'_{[2]} = 01$, $z'_{[2]} = 10$, yields $x_{[8]} = 00000000$, $y_{[8]} = 00000001$ and $z_{[4]} = 11111110$.

The process of scaling down signal widths is separated into two sequential phases.

Figure 2:
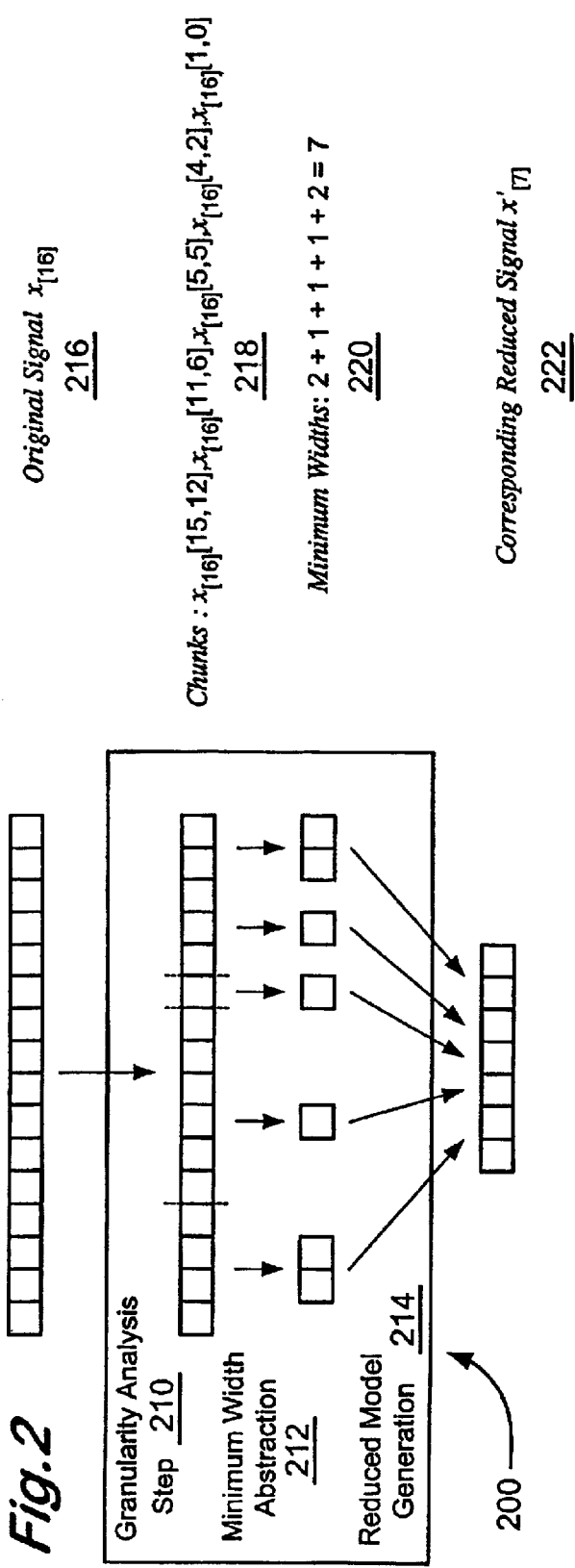
FIG. 2 shows the basic steps involved in the abstraction technique of this invention.

The basic idea of this abstraction technique is shown in the flow chart, 200, of FIG. 2, as will be described below. First, the coarsest granularity of each word-level signal $x_{[16]}$ is computed, as determined by the structural data dependencies in a granularity analysis step, 210. A granularity is a separation of a signal into several contiguous chunks, 218, which indicate the coarsest possible subsumptions of individual bits of the signal, which are treated in the exact same manner with respect to structural data dependencies. Then, for each chunk, the necessary minimum width, 220, is computed, as required by dynamical data dependencies in a minimum width abstraction step, 212. According to these computed minimum chunk widths, the reduced width for the corresponding variable is reassembled, in a reduced model generation step, 214, to be provide a reduced signal, 222.

The present invention provides an equational theory $BV_{ext}$ of fixed-size bitvectors, derived from the core theory of bitvectors. Let $B = \{0, 1\}$ denote the set of bit values 0 and 1. A bitvector of width $n \in \mathbb{N}_+$ is a vector element of $B^n$, consisting of n individual bits which are indexed from right to left, starting with index 0. Bitvectors are written as binary bitstrings, and, accordingly, the set $B^n$ of bitvectors of length n is denoted by $B_{[n]}$. The invention provides a bitvector variable definition wherein, for $n \in \mathbb{N}_+$, a bitvector variable $x_{[n]}$ of width n is a typed variable, representing fixed-size bitvectors $v \in B_{[n]}$ of width n.

Fixed-size in this context means that for each bitvector variable the width$_n$ is a fixed (but arbitrary) positive natural number. We write $x_{[n]}[i]$ to refer to the $i^{th}$ bit of $x_{[n]}$. $BV_{ext}$ includes bitvector variables and bitvector constants $c_{[n]}$, $n \in \mathbb{N}_+$ and $c \in B_{[n]}$. The present invention, compared to the core theory of bitvectors, provides additional high-level operators as tabulated in FIG. 3. Further operators, like shifts, rotations or further comparisons, are conveniently expressed within this theory. The Boolean predicates=and <occurring in the guards of ite (if-then-else) expressions, are defined on two bitvector arguments of equal width. Equality is defined bitwise, whereas< is defined according to the lexicographical order of bitstrings.

The set of terms is defined over a set of free bitvector variables and the operators shown in FIG. 3. If the terms are "well-formed" then the terms require variable widths to comply with operator demands, and index expressions must not exceed the widths of argument terms. A valuation is an assignment of values to the bitvector variables occurring in the terms. A system E of equations over such terms is satisfiable if there exists a valuation of the variables such that all equations of E hold simultaneously.

Correspondingly, we define the term "valid" such that E is universally valid if all possible valuations satisfy E.

In a fourth example, X[16] Y[41 and z [4] are bitvector variables. Consider:
1. $x_{[16]}[15,8] \oplus x_{[16]}[7,0] = x_{[16]}$
2. $x_{[16]} = neg(x_{16})$
3. $y_{[4]}$ and $1100_{[4]} = z_{[4]}$ Equation 1 is universally valid and Equation 2 is unsatisfiable. Equation 3 is satisfiable, e.g. by $y_{[4]} := 0111_{[4]}$ and $z_{[4]} := 0100_{[4]}$, but not universally valid.

In a fifth example $x_{[8]}$ and $y_{[4]}$ are bitvector variables.

$x_{[8]} = y_{[4]} \oplus y_{[4]}$
$x_{[8]}[4,4] = neg(x_{[8]}[0,0])$

Consider the system of equations given above. Taken separately, the first and second equations are satisfiable. However, the system of equations, as a whole, is unsatisfiable.

Figure 4:
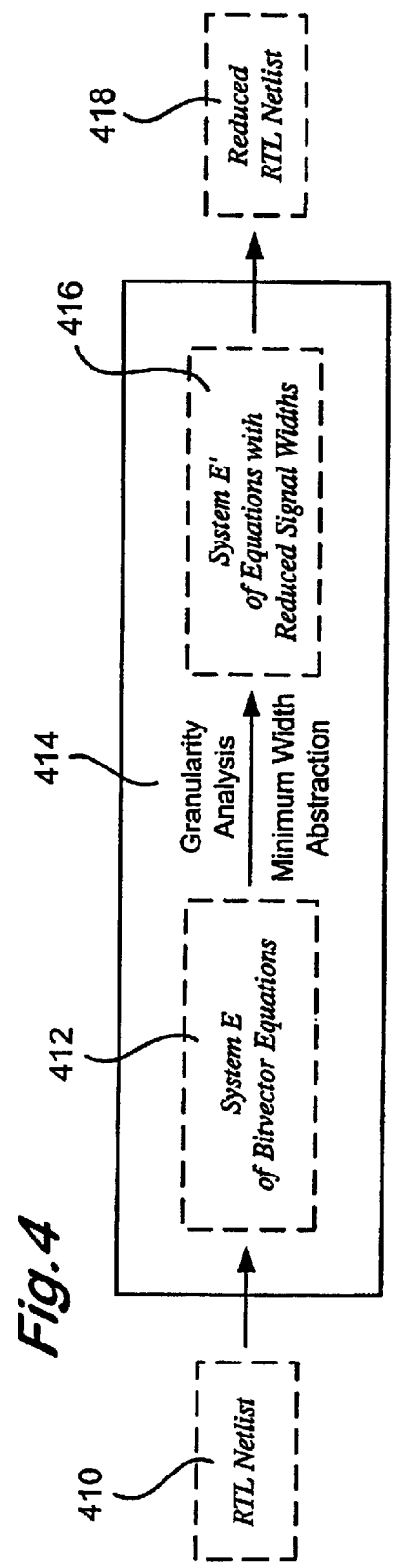
FIG. 4 is a flow chart detailing the generation of the reduced RTL model.

Referring now to FIG. 4, there is illustrated the steps of the proposed abstraction technique in accordance with the present invention. As a first step, the RTL representation of design, 410, and property is translated into a system E, 412, of equations of bitvector terms over $BV_{ext}$ such that:

E is satisfiable $\Longleftrightarrow$ Property does not hold for the Design    (5)

A possible solution of E, if existent, would be a counter-example which would give value assignments to all circuit signals, such that the property does not hold for these assignments.

The data dependencies within the bitvector equations of E are analysed, 414, and a second system E', 416, of bitvector equations is computed, in which the type (i.e. the width) of each bitvector variable is reduced to a smallest number of bits that is possible with respect to the abstraction technique, such that:

E' is satisfiable $\Longleftrightarrow$ E is satisfiable    (6)

From (5) and (6) it follows that:

E' is satisfiable $\Longleftrightarrow$ Property does not hold for the Design    (7)

E' is translated back to an RTL netlist, 418, representing a scaled down version of the original design. According to (7), the property checking task can be completely carried out on the reduced model.

Given a system E of bitvector equations over $BV_{etx}$, structural and functional dependencies are imposed on the bitvector variables by the high-level operators occurring in the equations. Dependencies may be found between complete variables or only between certain parts. For each variable, the present invention analyses such dependencies and determines the contiguous parts in which all bits are treated uniformly with respect to data dependencies.

Further definitions are now provided for 'Chunk' and 'Granularity': A chunk $x_{[-n]} < j, i>$, $o \leq i \leq j < n$, of a bitvector variable $x_{[n]}$ is a syntactical representation for a contiguous part of $x_{[n]}$, i.e. $x_{[n]} < j, i> := x_{[n]}[j, i]$.

Chunks are used to describe the above-mentioned contiguous parts of bitvector variables.

A granularity of a bitvector variable $x_{[n]}$ is any ordered decomposition of $x_{[n]}$ into chunks $\{x_{[n]} < j_2, i_1>, x_{[n]} < j_q, i_q> \} 0 = i_1 < j_1 = 1 = i_2 < j_2 + 1 = \ldots = i_q < j_q + 1 = n$, such that $x_{[n]}[j_q, i_q] \oplus \ldots \oplus x_{[n]}[j_2, i_2] \oplus x_{[n]}[j_1, i_1] = x_{[n]}.$ is a tautology In a sixth example, $x_{[16]}$ is a bitvector variable. $\{x_{[16]}<15, 18>, x_{[16]}<7,4>, x_{[16]}<3,0>\}$ is a granularity of $x_{[16]}$, whereas $\{x_{[16]}<15,10>, x_{[16]}<5,0>\}$ and $\{x_{[16]}<15,5>, x_{[16]}<10,0>\}$ is not.

Granularities are used to describe how different data dependencies exist for different chunks of a bitvector variable. Non-uniform structural dependencies occur whenever a variable (or a term) is not treated as a whole, but separated into parts upon which different operations are performed, e.g. by extractions or concatenations.

The relation between granularities and structural dependencies is shown in a further example: consider the following bitvector equation:

$$x_{[8]} = y_{[4]} \oplus z_{[4]}$$

The concatenation on the right hand side of the equation imposes different dependencies on the upper and lower part of $x_{[8]}$, the first depending on $y_{[4]}$, the latter on $z_{[4]}$. This is described by the granularity $\{x_{[8]}(7,4), x_{[8]}(3,0)\}$.

For each bitvector variable $x_{[n]}$, the method in accordance with one aspect of the invention computes the coarsest possible granularity which describes the splitting of data dependencies for $x_{[n]}$, as imposed by the equations of E. Slicing is performed only if necessary. For example, the equation $x_{[16]} = y_{[16]}[15,12] \oplus y_{[16]}[11,0]$ is equivalent to $x_{[16]} = y_{[16]}$ and does not require slicing of $x_{[16]}$. Hence, initially a normalization of all bitvector terms is performed. The computation of the coarsest granularities is carried out using an equivalence class structure which groups chunks between which functional dependencies are detected.

Granularity analysis and functional dependencies are shown in another example. The equation given in the fourth example imposes functional dependencies between $x_{[8]}[7,4]$ and $y_{[4]}3,0]$ and between $x_{[8]}[3,0]$ and $z_{[4]}[3,0]$. The resulting equivalence classes are $\{x_{[8]}<7,4>, y_{[4]}<3,0>\}$ and $\{x_{[8]}<3,0>, z_{[4]}<3,0>\}$. As a second example consider $x_{[16]} = y_{[16]}$ or $z_{[16]}$. Here, $x_{[16]}, y_{[16]}$ and $z_{[16]}$ are related to each other by a bitwise Boolean operator, requiring that all three go into the same equivalence class $\{x_{[16]}<15,0>, y_{[16]}<15,0>, z_{[16]}<15,0>\}$.

The equivalence class computation works incrementally and can efficiently be performed by employing a union-find algorithm, which, besides the known union( ) and find( ) operations, defines a new procedure slice( ). Initially, in each bitvector group of classes, 510, variable $x_{[n]}$ resides in its own singleton equivalence class: $\{x_{[n]}<n-1,0>\}$. Find ($x_{[n]}$, i) yields the (non ambiguous) equivalence class, which includes a chunk of $x_{[n]}$ which contains bit position i, union( ) performs the usual set union of two classes, and slice($x_{[n]},j,i$) calls find($x_{[n]},i$) and find($x_{[n]},j$) and splits all chunks of the respective classes at the bit positions corresponding to i and j and groups the originating parts in two new equivalence classes, as illustrated in FIG. 5, with a second group of classes, 512.

FIG. 6 exemplifies a granularity analysis in terms of bitvectors, dependency classes of bitvectors chunks and granularities. Each bitvector equation e is processed sequentially by the analyser and the next state of the equivalence class structure is computed by means of the procedure gran(e), which is outlined in process 1 as shown in FIG. 6a. Once all bitvector equations have been processed, for each bitvector variable the coarsest possible granularity is given by the state of the equivalence classes.

The granularity analysis decomposes the initial satisfiability problem for E into a number of independent satisfiability problems, characterized by the computed equivalence classes. The solutions of these problems can be characterized by bitwise bitvector functions, as will be defined as follows:

Let $n \in \mathbb{N}_+$: and $k \in \mathbb{N}_+$, a k-ary bitvector function on bitvectors of width n is a function.

$$F_{[n]}: \underbrace{B_{[n]} x \ldots x B_{[n]}}_{k} \to B_{[n]}.$$

Bitvector functions $G_{[1]}$: $B \times \ldots \times B \to B$ on bitvectors of width 1 are called Boolean functions.

Let $n \in \mathbb{N}_+$, $k \in \mathbb{N}_+$, and $F_{[n]}$ be a k-ary bitvector function on bitvectors of width n. $F_{[n]}$ is a bitwise bitvector function if there exists a k-ary Boolean function $G_{[1]}$ such that:

$$F_{[n]} \equiv (G_{[1]}, G_{[1]}, \ldots G_{[1]}) \text{ i.e. } \forall\, i \in \{0, \ldots, n-1\}: f_{[n]}(x^1_{[n]}, \ldots, x^k_{[n]})[i] = G_{[1]}(x^1_{[n]}, \ldots, x^k_{[n]}[i])$$

$F_{[n]}$ operates uniformly on all bit positions of its arguments according to $G_{[1]}$. If two k-ary bitwise Boolean functions $F^1_{[n]}$ and $F^2_{[m]}$, one taking bitvectors of width n as arguments and the other bitvectors of width m, operate according to the same Boolean function $G_{[1]}$, then this correspondence is denoted by $F^1_{[n]} \cong F^2_{[m]}$. in a ninth example $x_{[8]}, y_{[8]}, z_{[8]}$ are bit-vector variables of width 8 and let $x'_{[4]}, y'_{[4]}, z'_{[4]}$, be bit-vector variables of width 4. Let $F^1_{[8]}(x_{[8]}, y_{[8]}, z_{[8]}) := x_{[8]}$ and (neg ($y_{[8]}$) or $z_{[8]}$); and
$F^2_{[4]}(x'_{[4]}, y'_{[4]}, z'_{[4]}) := x'_{[4]}$ and (neg ($y'_{[4]}$)) or $z'_{[4]}$); and
$F^1_{[8]}$ and $F^2_{[4]}$ are bit-wise bit-vector functions with $F^1_{[8]} \cong F^2_{[4]}$. Furthermore, consider:
$GF^3_{[8]}(x_{[8]}, y_{[8]}, z_{[8]}) := (x_{[8]}[7,4]$ and $y_{[8]}[7,4]) \oplus z_{[8]}[3,0]$;

$F^3_{[8]}$ is a bitvector function, but not bit-wise.

Let C be one of the equivalence classes computed by the granularity analysis. The set of all satisfying solutions of E, projected to the chunks contained in C, can be characterized by a first theorem with respect to satisfiability:

If $C = \{x^1_{[n1]} < j_1, i_1>, \ldots, x^k_{[n]} < j_k, i_k>\}$,
with $j_1 - i_1 = \ldots = j_k - i_k = n$, then there exists a k-ary bit-wise bit-vector function:

$F_{[n]}(x^1_{[n]} < j_1, i_1>, \ldots, x^k_{[n]} < j_k, i_k>)$ such that the set of satisfying solutions of the equation $$F_{[n]}(x^1_{[n]} < j_1, i_1>, x^2_{[n]} < j_2, i_2>, \ldots, x^k_{[n]} < j_k, i_k>) = \underbrace{000\ldots 0}_{n},$$

describes the set of solutions of E, $$\text{projected to } x^1_{[n]} < j_1, i_1>, \ldots, x^k_{[n]} < j_k, i_k>.$$

Referring now to FIG. 7, there is shown an equivalence class $C_i$ containing chunks of width $n_1$. For each such class $C_1$, a $\phi(C_1) \leq n_i$ is computed, $\phi(C_i)$ depending on the number of chunks residing in $C_1$ and on the number of possible inequalities between these chunks, as determined by the guards of if-then-else expressions in the bitvector equations.

The satisfiability problem $B_{[n1]}$, which is related to $C_1$ according to method 1, is satisfiable if and only if the modified satisfiability problem $B_{[\phi(Ci)]}$, in which each chunk of $C_i$ is replaced by a corresponding chunk of width $\phi(C_i)$, i.e. we have $B_{[n1]} \cong B_{[\phi(Ci)]}$, is satisfiable.

We will now consider the reduction of bitvector widths with a second method: Let $V_{[n]} = \{x^1_{[n]}, x^2_{[n]}, x^k_{[n]}\}$ be a finite set of k bitvector variables of width n $\in \mathbb{N}_+$. Let $F_{[n]}(x^1_{[n]}, x^2_{[n]}, \ldots x^k_{[n]})$ be a k-ary bitwise bitvector function on $V_{[n]}$, and let $I \subseteq V_{[n]} \times V_{[n]}$ be a set of pairs of elements of $V_{[n]}$, such that $P_1, \ldots, P_q$ are the connected components of the corresponding undirected graph $(V_{[n]}, I)$. Let $\phi(V_{[n]},E) := |V_{[n]}| - |\{P_1, \ldots, P_q\}| = k-q$ and let m:=max $\{\phi(V_{[nh]},E),1\}$. Then the following equivalence holds:

There exists a valuation $v$ of $x_{[n]}^1, \ldots, x_{[n]}^k$ such that $F_{[n]}(v(x_{[n]}^1), \ldots, v(x_{[n]}^k)) = 0_{[n]}$

EINBETTEN and for all $(x_{[n]}^i, x_{[n]}^j) \in I : v(x_{[n]}^i) \neq v(x_{[n]}^j)$ $\Leftrightarrow$ There exists a valuation $v$ of $x'^1_{[m]}, \ldots, x'^k_{[m]}$ of such that $F_{[m]}(v(x'^1_{[m]}), \ldots, v(x'^k_{[m]})) = 0_{[m]}$ and for all $(x_{[m]}^i, x_{[m]}^j) \in I : v(x'^i_{[m]}) \neq v(x'^j_{[m]})$ where $F_{[m]}(x'^1_{[m]}, x'^2_{[m]}, \ldots, x'^k_{[m]})$ is the corresponding bitwise bitvector function with $F_{[m]} \cong F_{[n]}$ on bitvectors $x'^1_{[m]}, x'^2_{[m]}, \ldots, x'^k_{[m]}$ of width m.

The information about possible inequalities is obtained during the Granularity Analysis and annotated within the equivalence classes. For each equivalence class C we define $\phi(C) := \max\{\phi(V_{[n]},I),1\}$, where $V_{[n]}$ is the set of chunks in C, and I is the set of possible inequalities annotated to C. The reduced system E' of bitvectors equations is constructed according to process 2.

Example 10

Let $x_{[8]}, y_{[16]}, z_{[16]}$ be bitvector variables and assume that E contains the following equation:

$$x_{[8]} = (y_{[16]} \text{ and } z_{[16]})[15,8] \tag{8}$$

Assume that granularity analysis and minimum width abstraction yield the following results:

$C_1 = \{\ldots, x_{[8]}<7,0>, y_{[16]}<15,8>, z_{[16]}<15,8>, \ldots\}; \phi(C_i)=2$ $C_{i+1} = \{\ldots, y_{[16]}<7,0>, z_{[16]}<7,0>, \ldots\}; \phi(C_{i+1})=3$ The granularity of $y_{[16]}$, for example, is given by:

$\{y_{[16]}<15,8>, y_{[16]}<7,0>\}$, i.e. $y_{[16]}[15,8] \oplus y_{[16]}[7,0]$

According to the minimum chunk widths, the corresponding reduced variable is assembled as follows:

$\{y'_{[5]}(4,3), y'_{[5]}<2,0>\}$, i.e. $y'_{[5]} = y'_{[5]}[4,3] \oplus y'_{[5]}[2,0]$ Hence, the reduced equation of E', which corresponds to (8) of E is:

$$x'_{[2]} = (y'_{[5]} \text{ and } z'_{[5]})[4,3] \tag{9}$$

Indices of extraction expressions are modified according to the new chunk widths.

Method 1 and method 2 yield that the original system E of bitvector equations is satisfiable if and only if the reduced system E', where all chunks of each class $C_i$ are reduced to a width, $\phi(C_1)$, is satisfiable.

Accordingly a third method is applied: The reduced system E' of bitvector equations which results from the proposed abstraction technique is satisfiable if and only if the original equational system E is satisfiable. For each solution of the reduced system a solution of the original system can be computed.

It is to be understood that $\phi(C)$ depends only on the sizes and number of the connected components of the corresponding undirected graph of C and I. The computation of the number of connected graph components for each class can efficiently be done by using a union-find algorithm, and, moreover, can be embedded within the computation of the equivalence classes during the granularity analysis.

Let $V_{[n]} = \{x^1_{[n]}, \ldots, x^k_{[n]}\}$ be a set of bitvector variables, $B_{[n]}(x^1_{[n]}, \ldots, x^k_{[n]})$ be a bitwise bitvector function and $I \subseteq V_{[n]} \times V_{[n]}$. For $m \in \mathbb{N}_+$, let $B_{[m]}$ denote the corresponding bitwise bitvector function with $B_{[m]} \cong B_{[n]}$ on bitvector variables $x'^1_{[m]}, \ldots, x'^k_{[m]}$ of width m, and let $P(B_{[m]},I)$ denote the following satisfiability problem:

There exists a valuation v of $x^1_{[m]}, \ldots x^k_{[m]}$ such that:

$P(B_{[m]},I) \iff B_{[m]}(v(x^1_{[m]}), \ldots, v(x^k_{[m]}))=0_{[m]}$ and for all $(x^i_{[n]}, x^j_{[n]}) \in I : v(x^i_{[m]}) \neq v(x^j_{[m]})$ According to Theorem 1, each satisfiability problem belonging to an equivalence class C can be described by a bitwise bitvector function $B_{[n]}$ and a set of inequalities I The reduced chunk width $m := \phi(C)$ computed in Theorem 2 is independent of any further mathematical property of $B_{[n]}$, i.e. we purposely abstract from the concrete aspects of $B_{[n]}$ except for bitwise operation. m is minimal with respect to this abstraction, which leads to a fourth theorem, relating to minimality:.

Let $V_{[n]} = \{x^1_{[n]}, \ldots, x^k_{[n]}\}$ be a finite set of k bitvector variables of width $n \in \mathbb{N}_+$. Let $I \subseteq V_{[n]}$, and let $m := \max\{\phi(V_{[n]}, I), 1\}$. Then there exists a k-ary bitwise bitvector function $B_{[n]}(x^1_{[n]}, \ldots, x^k_{[n]})$ such that $P(B_{[m]},I) \iff P(B_{[n]},I)$ and not $(P(B_{[m-1]},I) \iff P(B_{[n]},I))$ i.e. m is the minimum width for which $P(B_{[m]},I)$ is satisfiable if and only if $P(B_{[n]},I)$ is satisfiable.

Figure 8:
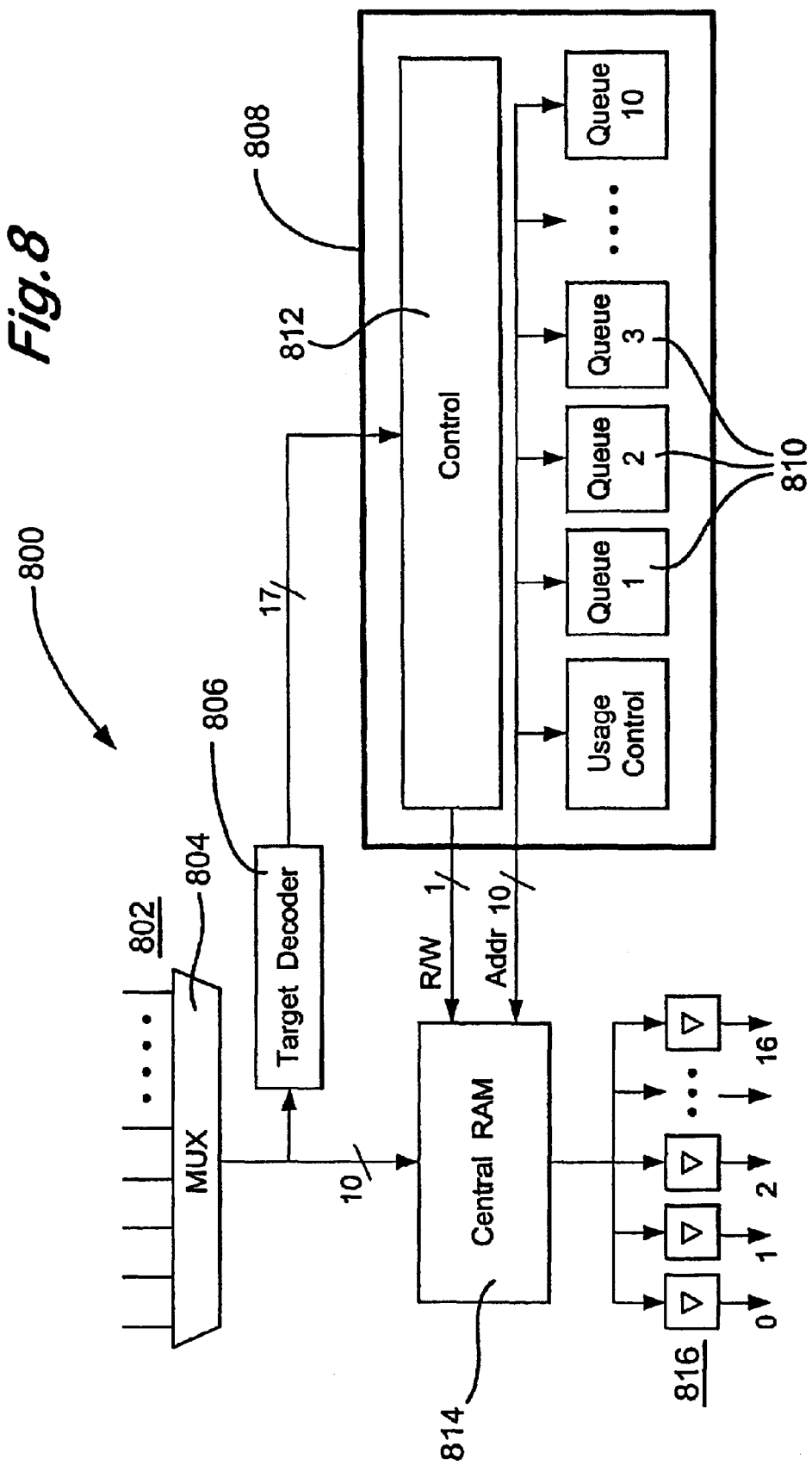
FIG. 8 shows a block diagram of an Asynchronous Transfer Mode (ATM) switching element operable in accordance with the invention.
Figure 10:
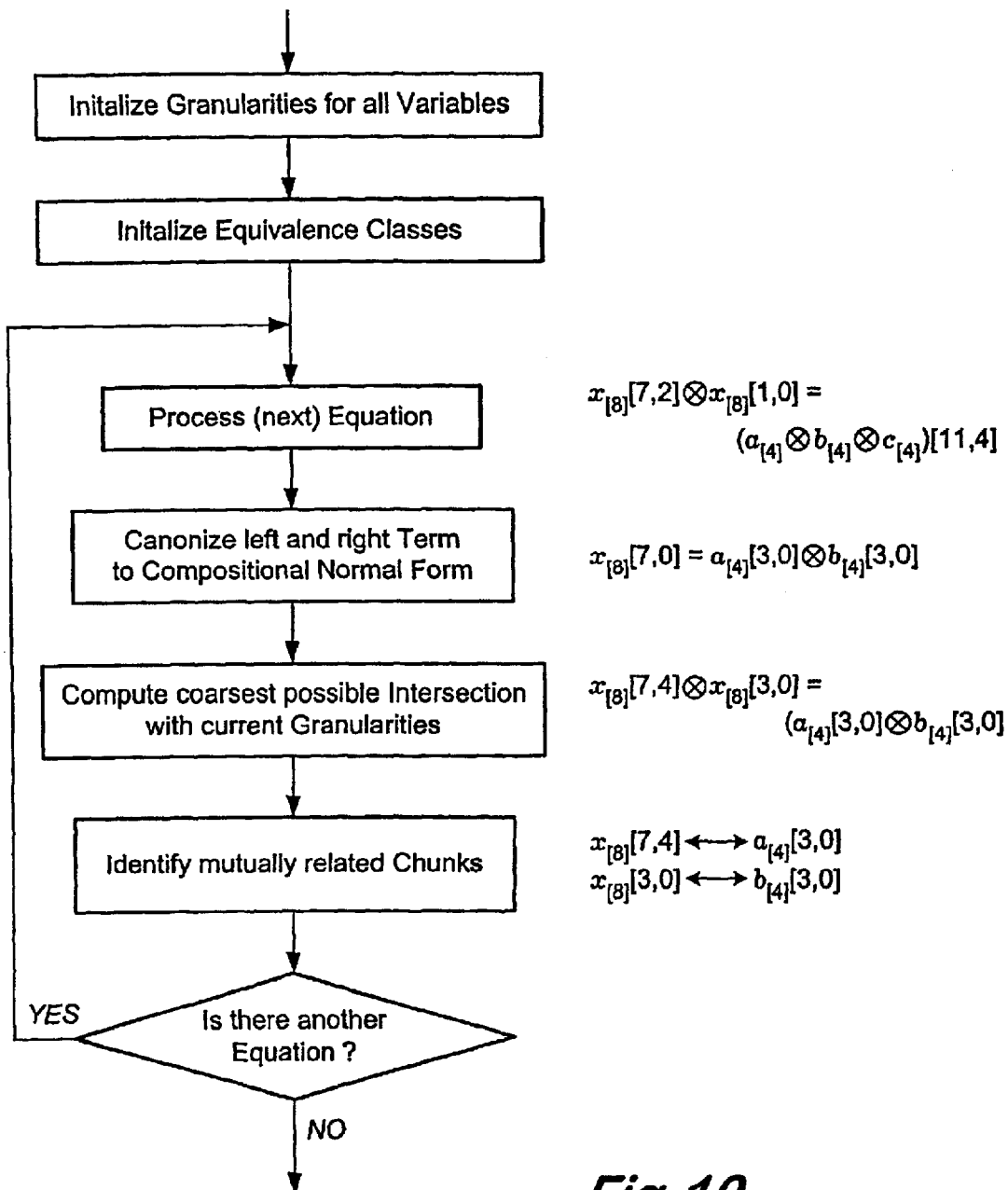
FIG. 10 shows a granularity analysis flow chart together with a first example.
Figure 11:
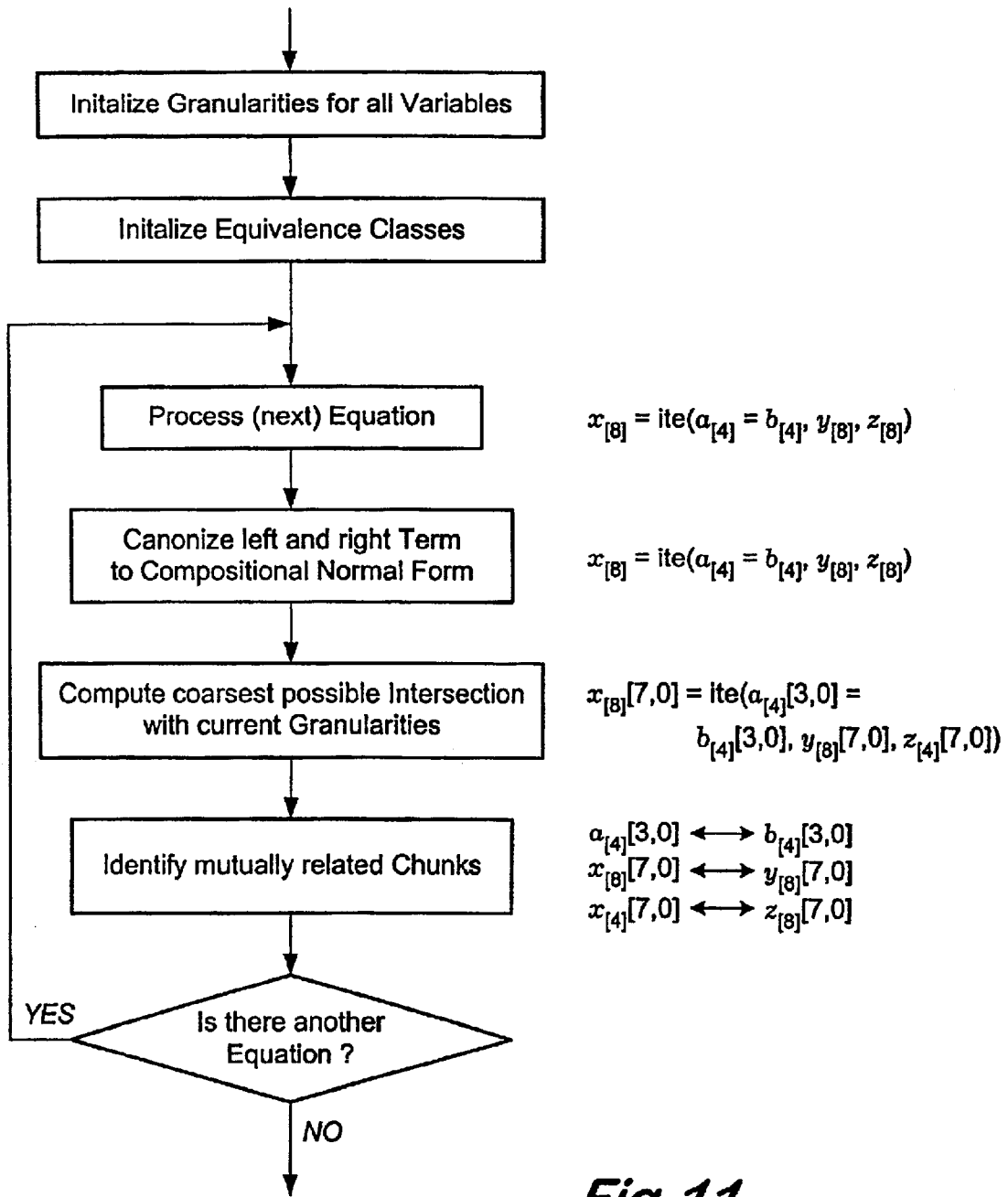
FIG. 11 shows a granularity analysis flow chart together with a second example.
Figure 12:
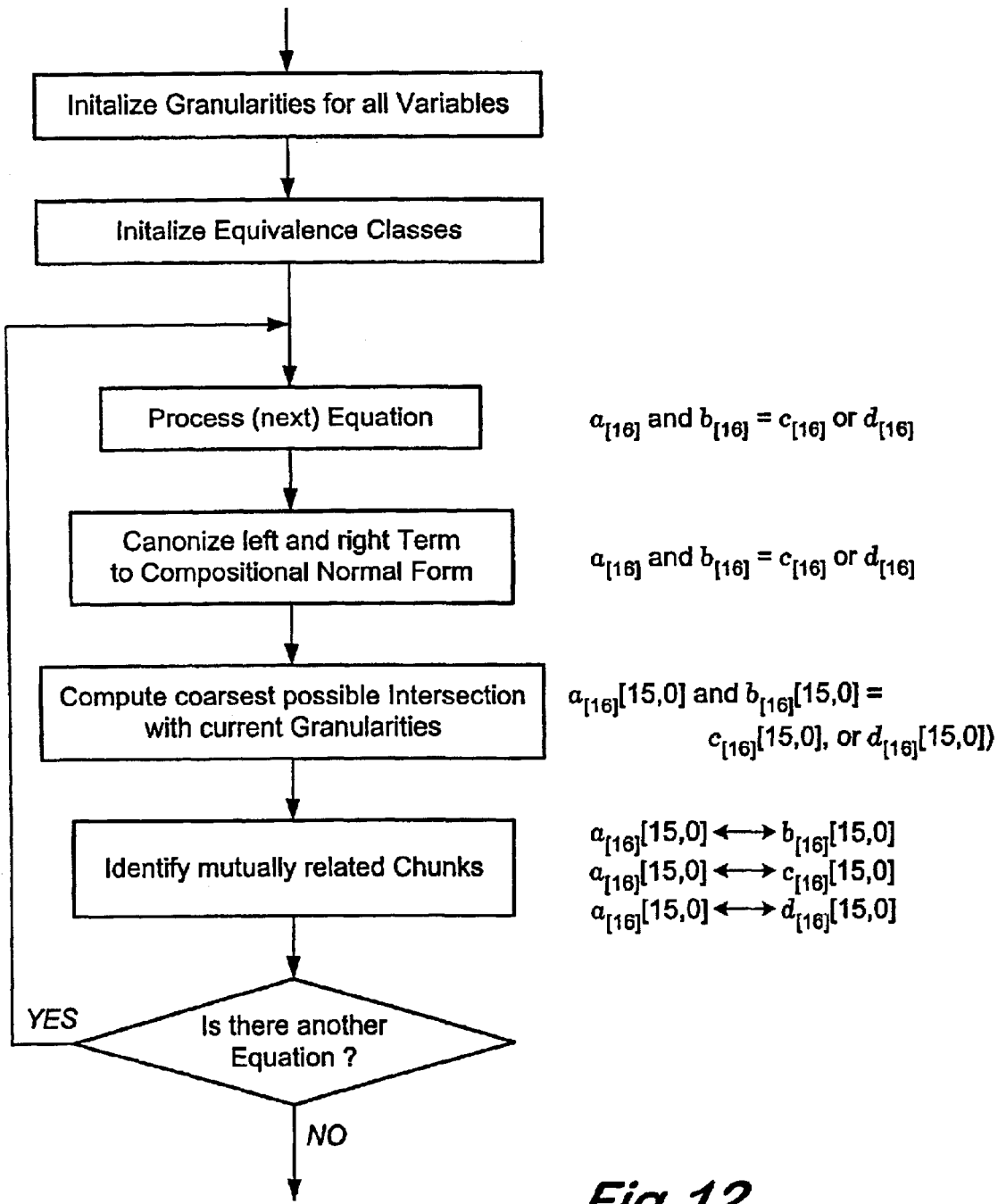
FIG. 12 shows a granularity analysis flow chart together with a third example.
Figure 13:
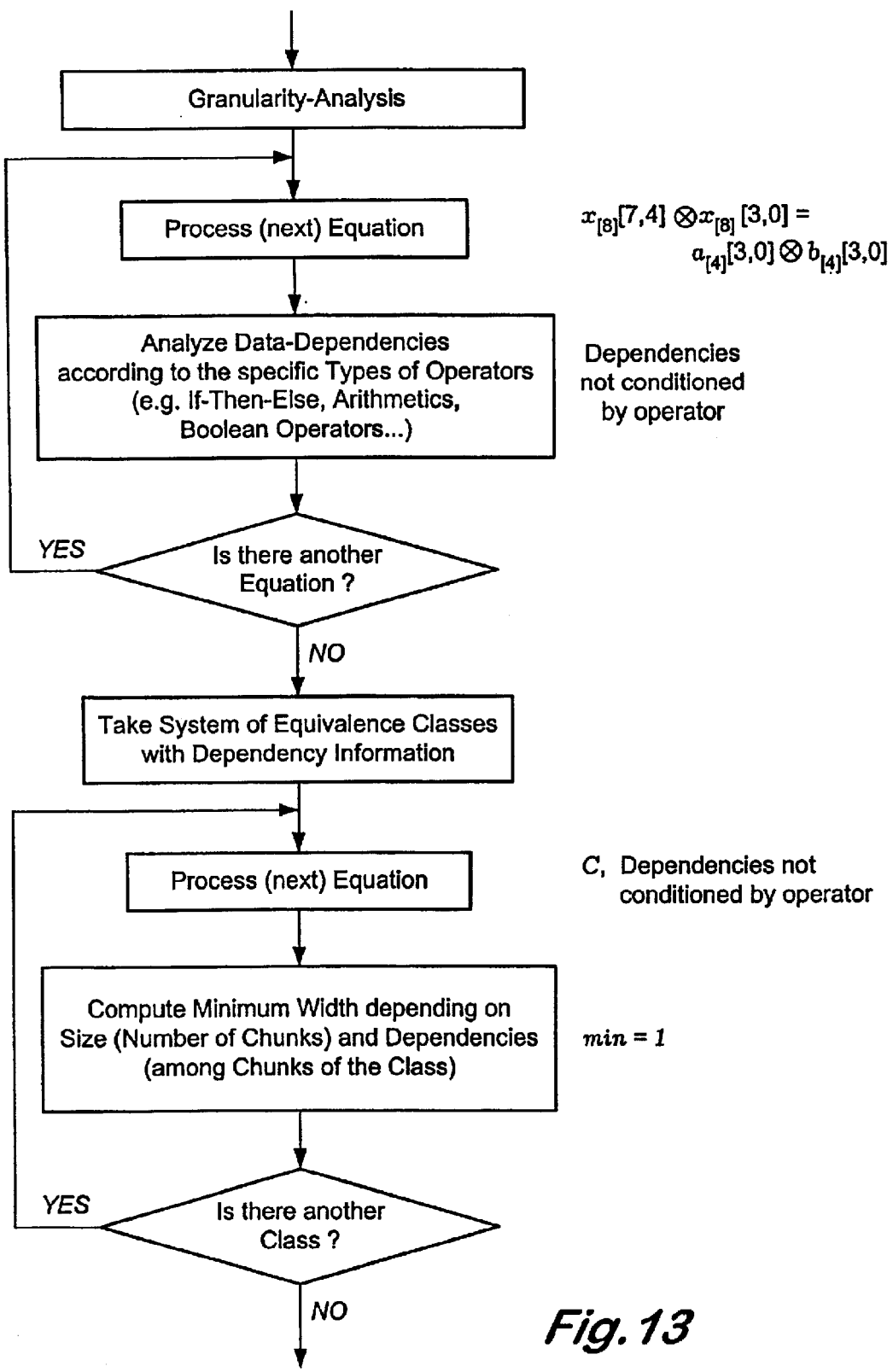
FIG. 13 shows a minimal width abstraction flow chart together with a first example.
Figure 14:
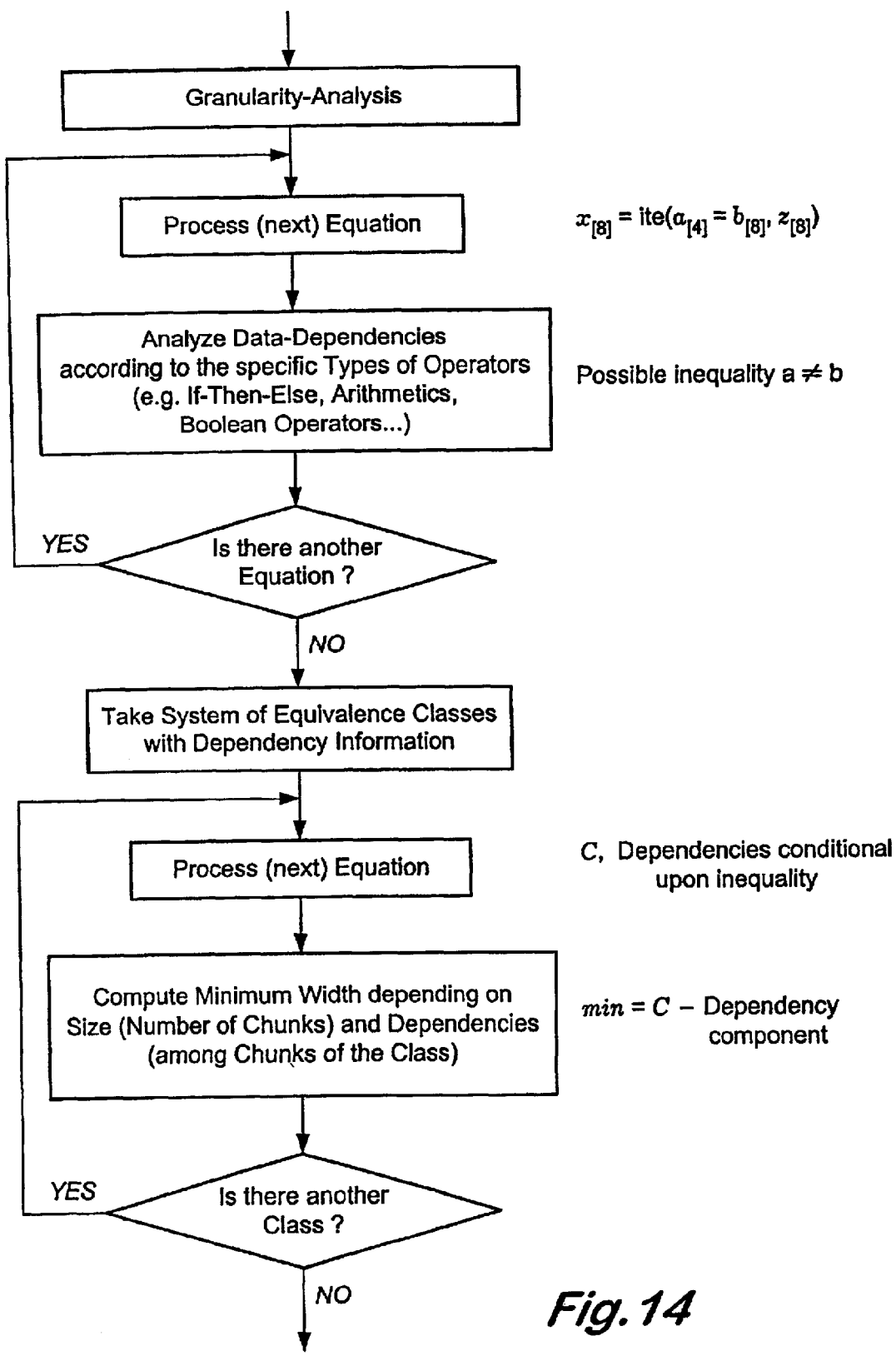
FIG. 14 shows a minimal width abstraction flow chart together with a second example.
Figure 15:
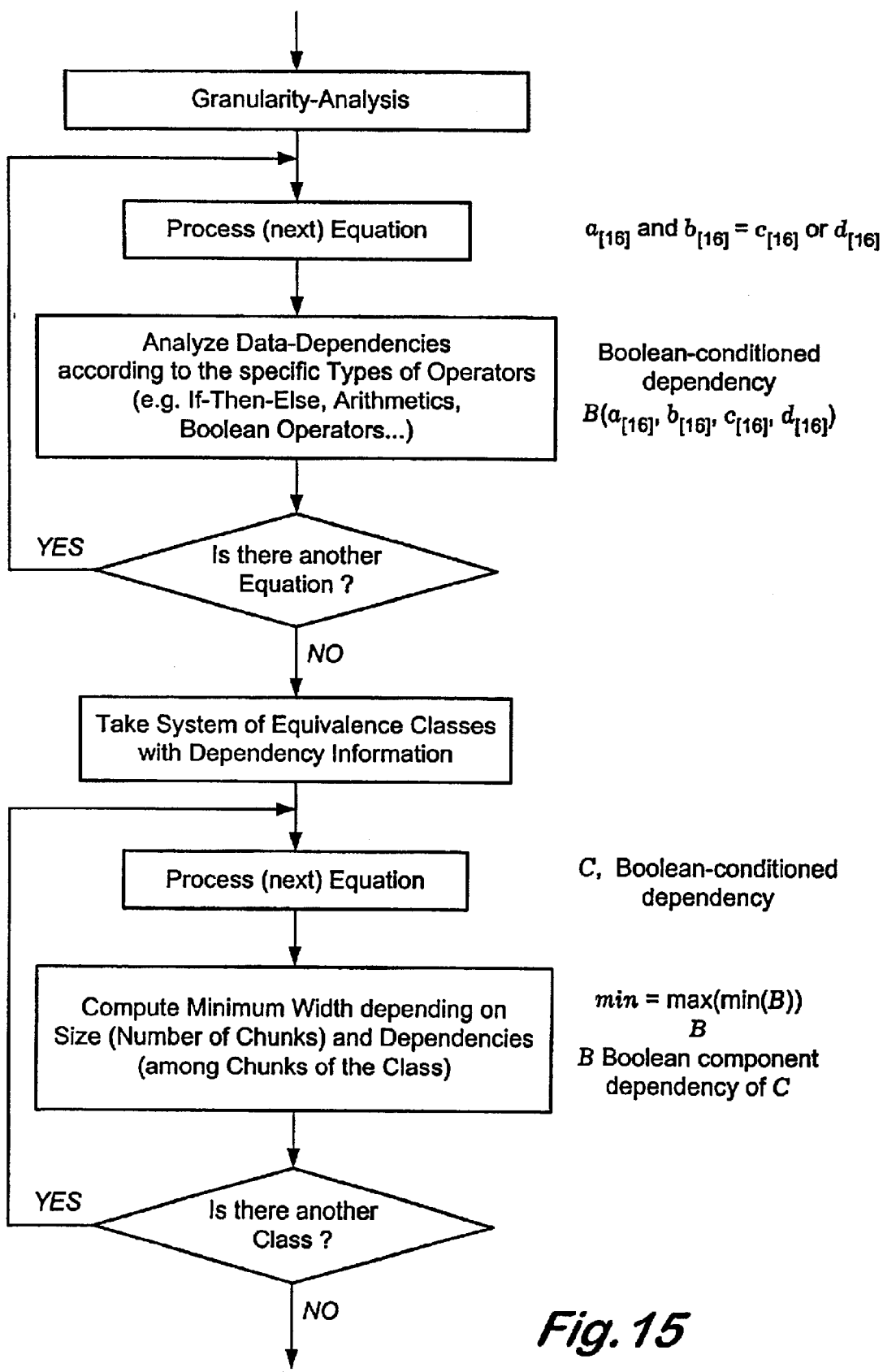
FIG. 15 shows a minimal width abstraction flow chart together with a third example.
Figure 16:
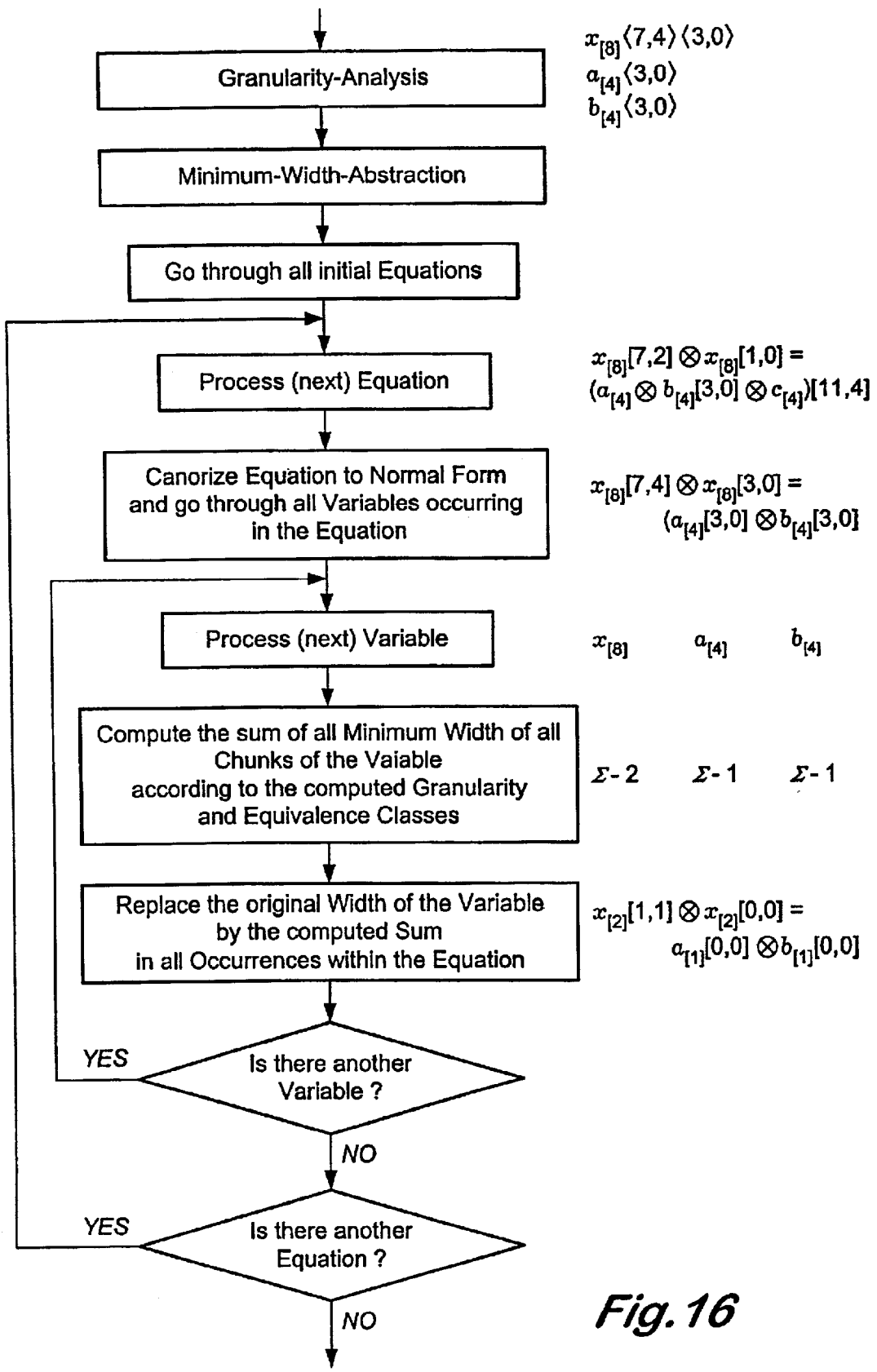
FIG. 16 shows a model generation flow chart together with a first example.
Figure 17:
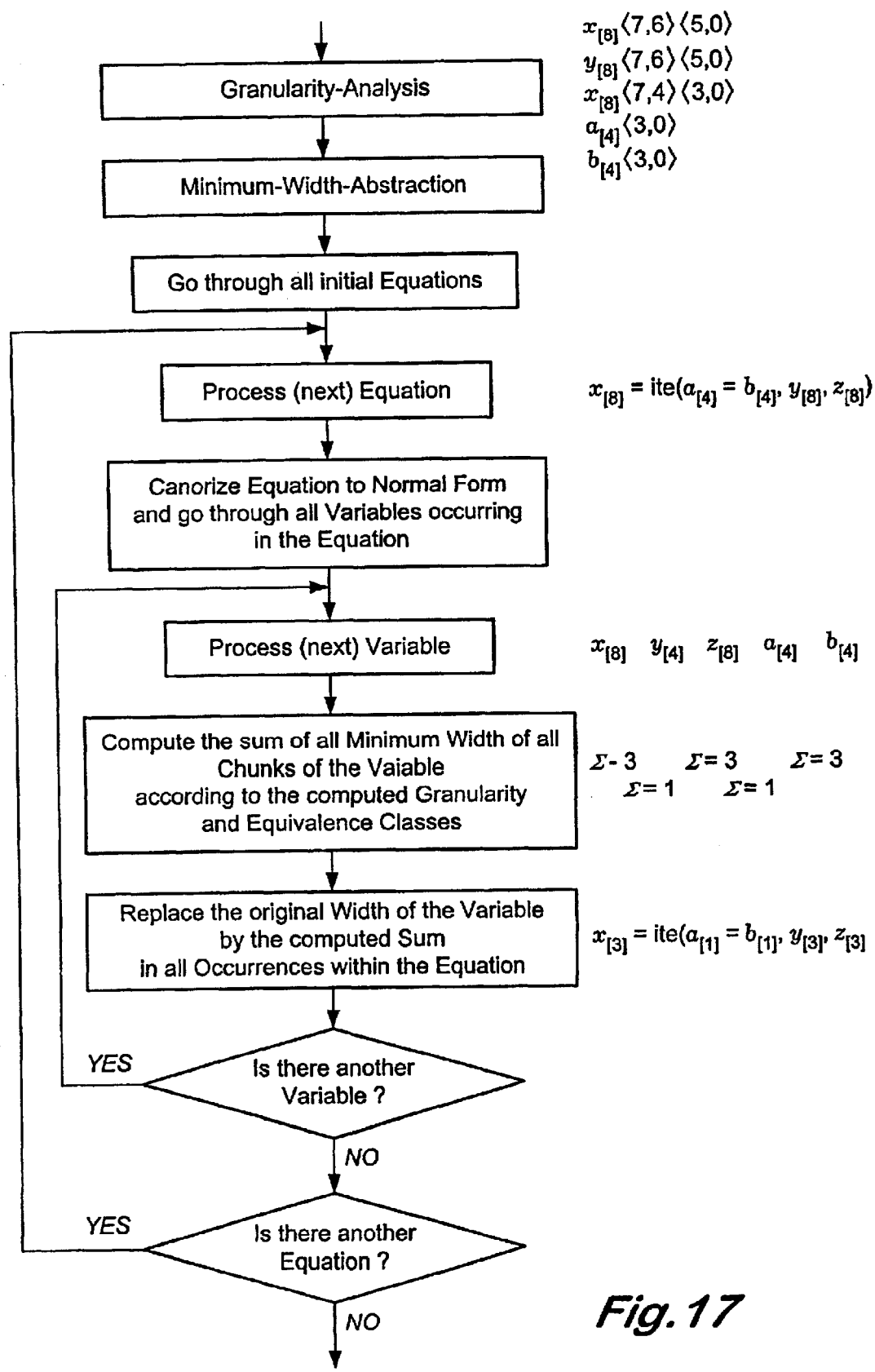
FIG. 17 shows a model generation flow chart together with a second example.
Figure 18:
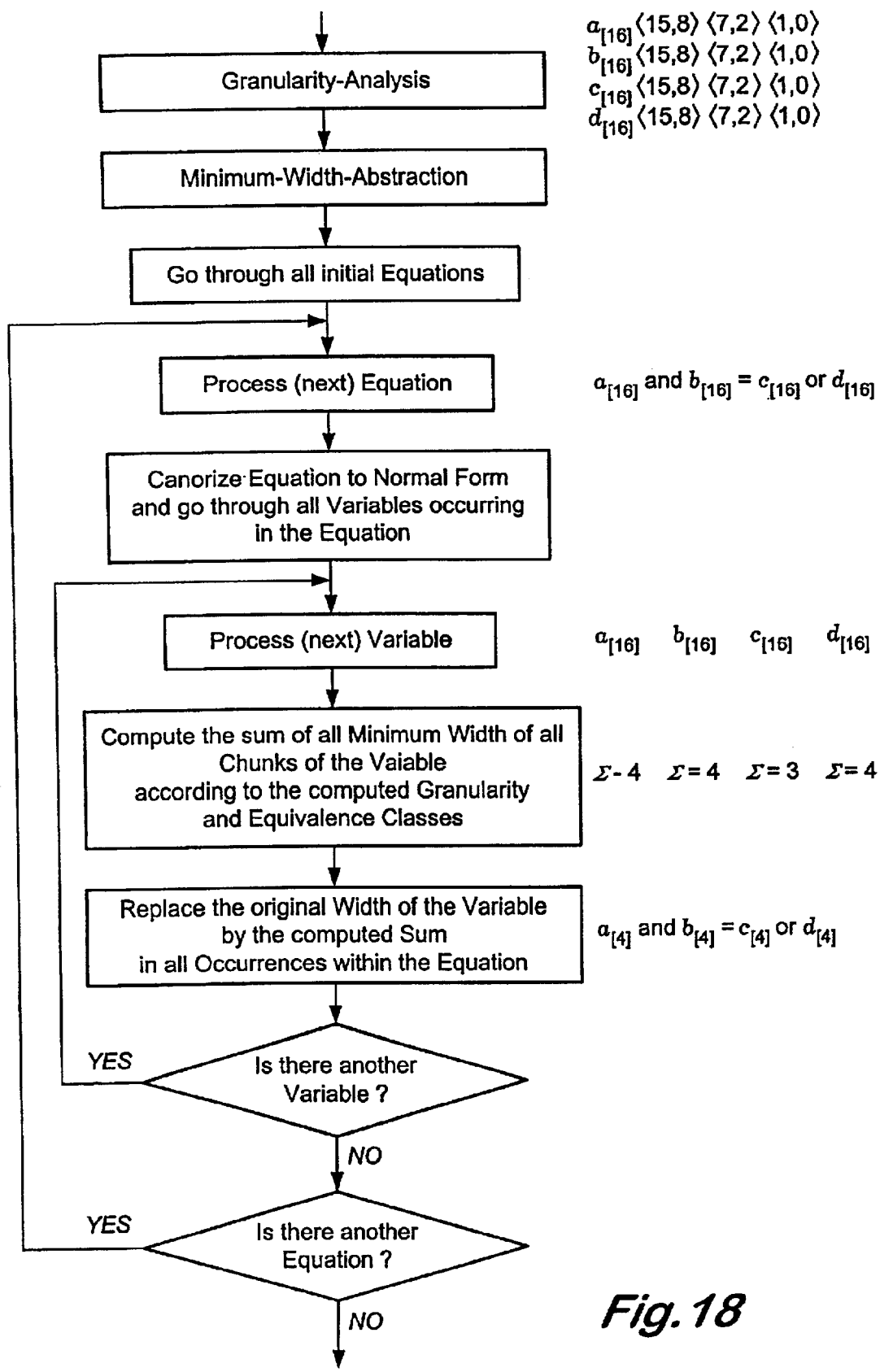
FIG. 18 shows a model generation flow chart together with a third example.

A prototype system was implemented in C++ and tested in several case studies at the Design Automation department of Siemens Corporation in Munich and at the Computer Network Peripherals department of Infineon Technologies in San Jose, Calif. All test cases were run on an Intel Pentium II PC with a 450 MHz CPU, 128 MB main memory and a Linux operating system. Referring to FIG. 8, which shows a block diagram of an ATM switching element 800, a case study of an address management unit of an ATM switching element will now be discussed. Results are tabulated in FIG. 9. The design comprised of approximately 3000 lines of Verilog code, the netlist synthesis comprised of approximately 24.000 gates and 35.000 RAM cells. Signals input to cell inputs 802, which are multiplexed by multiplexer, 804, to a central RAM, 814, or via a target decoder 806 to an RTL unit 808, which provides signals to the central RAM. The RTL unit incorporates 16 FIFO queue buffers, 810, and complex control logic, 812. Memory addresses are fed to 33 input channels to the multiplexer unit, 804, stored in FIFO's and, upon request, output from one of 17 output channels, 816, while the cell sequence is preserved and no addresses are allowed to be dropped from the management unit.

The prototype was used as preprocessor to a collection of known property checking tools. Three different properties, nop, read and write were required to be verified, which specified the intended behaviour within a range of 4 timesteps (nop, write), respectively 6 timesteps (read). It transpired that the write property did not hold due to a design bug in the Verilog code. A counterexample for the reduced model was found by the property checkers and recomputed by the prototype into a counterexample for the original design, whereupon the bug was fixed by the designers and the property was again checked on the corrected design (write fail, write hold). All runtimes on the reduced models were compared to those achieved on the original design without preprocessing. The results are given in CPU seconds (respectively minutes) and are shown in FIG. 9.

The present invention provides a significant reduction in the different sizes of the design models and a tremendous drop in the runtimes of the property checkers. Design sizes could be reduced to approximately 30% of the original sizes, and runtimes dropped from between half and three quarters of an hour to minutes or even seconds. Note, in particular, that the computation times the prototype took to analyse the designs and generate the reduced models, ranging between 3 and 7 seconds, are negligible compared to the runtimes of the property checkers.

FIGS. 10–18 show flow charts for granularity analysis, minimal width abstraction, model generation, together with three corresponding examples.

Reduced runtimes and a reduced requirement for memory needed in computations is one requirement to match today's sizes of designs in hardware verification. The present invention provides an abstraction technique which, given a high-level circuit and a property specification, scales down the design by reducing the widths of input, output and internal signals. The method provides a one-to-one abstraction, which yields minimal models with respect to the minimality statement we have given. If a property fails, counterexamples for the original design can be computed from counterexamples for the reduced model. Pre- and post-processing of design and counterexample and the property checking process itself are strictly separated. The proposed method is independent of the system realization of the property checker and can be combined with a variety of existing verification techniques which take RTL netlists as input, no matter if the underlying prover engines operate on bit-level (like SAT or BDD-based approaches), or use high-level techniques (e.g. Integer Linear Programming, Arithmetic Constraint Solving). The approach is particularly well suited to SAT and BDD-based hardware verification, since the complexity of those techniques depends on the number of variables such provers have to deal with.

In known SAT and BDD-based circuit verification such variables are created (at least) for each single bit of each signal of the circuit. In Bounded Property Checking even multiple instances of each variable and each signal have to be created for each step of the considered interval of time. In practice, design sizes range from several thousands up to 2–5 million gates and typical bounded properties incorporate 2–30 timesteps depending on the field of application.

APPENDIX

Algorithm 2 Reduced Model Generation

```
1  for each bitvector variable x_[n] {
2    m :=0;
3    for each chunk x_[n](j,i) of the computed granulartiy of x_[n] {
4      C :=find (x_[n](j,i));    //equivalence class containing x_[n](j,1)
5      m :=m + φ(C);
6    }
7    if (m≧n) then m :=n;
```

APPENDIX-continued

Algorithm 2 Reduced Model Generation

```
8    replace all occurrences of x_[n] of bitvector equations by x'_[m]
9    and adjust all extraction expressions affected by x_[n];
10 }
```

What is claimed is:

1. A digital circuit design verification method comprising:
   determining, for each property of a non-reduced RTL model, a reduced RTL model for a design specification by reducing widths of signals occurring in the non-reduced RTL model of the design specification to produce the reduced RTL model retaining the signal property of the non-reduced RTL model; and
   subjecting the reduced RTL model to a property checking process.

2. The digital circuit design verification method in accordance with claim 1, further comprising:
   determining the design specification and properties of a digital circuit design prior to said determining of the reduced RTL model; and
   synthesizing an RTL netlist of high level primitives, so that the digital circuit is defined as an interconnection of control and data path portions where signals of a width n are determined such that $n \in N_+$, wherein $N_+$ is a positive integer number, and bit vectors of respective lengths each determine a signal value.

3. The digital circuit design verification method in accordance with claim 1,
   wherein in the property checking process, an internal bit-level representation contains a bit-level variable for each bit of each word signal, and
   wherein said method further comprises sequentially passing the internal bit-level representation to a verification engine and then to a property test unit, to provide a positive result if the property checking holds true and to provide a counter example if the property checking does not hold true.

4. The digital circuit design verification method in accordance with claim 3, further comprising performing signal width enhancement to create a counterexample for the non-reduced RTL model, if the counter example is produced for the reduced RTL model.

5. The digital circuit design verification method in accordance with claim 1,
   wherein the non-reduced RTL model includes word-level signals formed of bit-vectors, and
   wherein said determining the reduced RTL model is separated into two sequential steps for each bit-vector variable:
     computing a coarsest granularity of each word-level signal to separate each word-level signal into several contiguous chunks indicating basic groups of bits with respect to structural data dependencies, and
     computing a minimum width with respect to dynamic data dependencies.

6. The digital circuit design verification method in accordance with claim 5, wherein, for each bit-vector variable, said computing of coarse granularities is performed by an equivalence class structure, with an initial satisfiability problem considered as a number of independent satisfiability problems.

7. The digital circuit design verification method in accordance with claim 6, further comprising solving the independent satisfiability problems by bit wise bit-vector functions.

8. A digital circuit design verification tool, comprising:

a pre-property checking unit to reduce widths of signals occurring in a non-reduced RTL model of an input design specification for a digital circuit, to produce a reduced RTL model; and a verification engine, coupled to the pre-property checking unit, to verify whether signal properties of the non-reduced RTL model hold for the reduced RTL model.

9. The digital circuit design verification tool according to claim 8, further comprising a front end unit, coupled to said pre-property checking unit and to receive input data relating to a design specification and property characteristics of a design to be verified, to provide an RTL netlist of the design specification and property characteristics, so that the digital circuit is defined as an interconnection of control and data path portions, where signals of a width n are determined such that $n \in N_+$ wherein $N_+$ is a positive integer number, and bit vectors of respective lengths determine signal values.

10. The digital circuit design verification tool in accordance with claim 8, wherein said pre-property checking unit produces a reduced RTL representation and an internal bit-level representation containing one bit for each bit of each word signal, and wherein said digital circuit design verification tool further comprises:

a verification engine, coupled to said pre-property checking unit, to receive the internal bit-level representation; and a property test unit, coupled to said verification engine, to receive the internal bit-level representation, to provide a positive result if a circuit property holds true and to provide a counter example if the circuit property does not hold true.

11. The digital circuit design verification tool in accordance with claim 10, further comprising a signal width enhancement unit, coupled to said property test unit, to receive the counter example for reduced RTL data and to expand the signal width to provide a counter example for the non-reduced RTL model.

12. The digital circuit design verification tool in accordance with claim 8, wherein the non-reduced-width RTL model includes word-level signals formed of bit-vectors, and wherein said digital circuit design verification tool further comprises:

a coarse granularization unit to determine, for each bit-vector variable, a coarse granularization of each word-level signal and to separate each word-level signal into several contiguous chunks indicating basic groups of bits with respect to structural data dependencies; and a minimum width determination unit, coupled to said coarse granularization unit, to determine a minimum width with respect to dynamic data dependencies.

13. The digital circuit design verification tool in accordance with claim 12, further comprising an arranging unit, coupled to said minimum width determination unit, to arrange coarse granularities in terms of an equivalence class structure with an initial satisfiability problem considered as a number of independent satisfiability problems.

* * * * *